(12) United States Patent
Wang et al.

(10) Patent No.: US 7,229,535 B2
(45) Date of Patent: Jun. 12, 2007

(54) HYDROGEN BUBBLE REDUCTION ON THE CATHODE USING DOUBLE-CELL DESIGNS

(75) Inventors: Yan Wang, Sunnyvale, CA (US); Feng Q. Liu, San Jose, CA (US); Alain Duboust, Sunnyvale, CA (US); Siew S. Neo, Santa Clara, CA (US); Liang-Yuh Chen, Foster City, CA (US); Yongqi Hu, Campbell, CA (US)

(73) Assignee: Applied Materials, Inc., Santa Clara, CA (US)

( * ) Notice: Subject to any disclaimer, the term of this patent is extended or adjusted under 35 U.S.C. 154(b) by 420 days.

(21) Appl. No.: 10/455,861

(22) Filed: Jun. 6, 2003

(65) Prior Publication Data

US 2003/0216045 A1    Nov. 20, 2003

Related U.S. Application Data

(63) Continuation-in-part of application No. 10/032,275, filed on Dec. 21, 2001, now Pat. No. 6,899,804.

(51) Int. Cl.
*C25F 7/00* (2006.01)
*B23H 5/06* (2006.01)
*C25F 3/00* (2006.01)
*C25F 3/12* (2006.01)
*C25F 3/30* (2006.01)
*B23H 3/00* (2006.01)

(52) U.S. Cl. ................. 204/252; 204/224 M; 205/662; 205/663

(58) Field of Classification Search ..................... None
See application file for complete search history.

(56) References Cited

U.S. PATENT DOCUMENTS 2,582,020 A    1/1952    Emery (Continued)

FOREIGN PATENT DOCUMENTS

EP    0 527 537    2/1993

(Continued)

OTHER PUBLICATIONS

F.C. Walsh, "Electrochemical Technology for Environmental Treatment and Clean Energy Conversion", Pure and Applied Chemistry, vol. 73, No. 12, pp. 1819-1837, 2001, no month.*

(Continued)

*Primary Examiner*—Harry D Wilkin, III
(74) *Attorney, Agent, or Firm*—Patterson & Sheridan

(57) ABSTRACT

An apparatus and method for planarizing a surface of a substrate using a chamber separated into two parts by a membrane, and two separate electrolytes is provided. The embodiments of the present invention generally provide an electrochemical mechanical polishing system that reduces the number of defects found on the substrate surface after polishing. An exemplary electrochemical apparatus includes a physical barrier that prevents any trapped gas or gas generated during processing from residing in areas that can cause defects on the substrate. The process can be aided by the addition of various chemical components to the electrolyte that tend to reduce the gas generation at the cathode surface during the ECMP anodic dissolution process.

20 Claims, 5 Drawing Sheets

U.S. PATENT DOCUMENTS

| | | | |
|---|---|---|---|
| 3,239,441 A | 3/1966 | Marosi | |
| 3,873,512 A | 3/1975 | Latanision | |
| 4,263,113 A | 4/1981 | Bernard | 204/146 |
| 4,369,099 A | 1/1983 | Kohl et al. | |
| 4,663,005 A | 5/1987 | Edson | |
| 4,666,683 A | 5/1987 | Brown et al. | 423/24 |
| 4,793,895 A | 12/1988 | Kaanta et al. | |
| 4,797,190 A | 1/1989 | Peck | |
| 4,934,102 A | 6/1990 | Leach et al. | |
| 4,992,135 A | 2/1991 | Doan | |
| 5,002,645 A | 3/1991 | Eastland, Jr. et al. | 204/157.2 |
| 5,096,550 A | 3/1992 | Mayer et al. | |
| 5,114,548 A | 5/1992 | Rhoades | |
| 5,129,981 A | 7/1992 | Wang et al. | |
| 5,209,816 A | 5/1993 | Yu et al. | |
| 5,217,586 A | 6/1993 | Datta et al. | |
| 5,256,565 A | 10/1993 | Bernhardt et al. | |
| 5,340,370 A | 8/1994 | Cadien et al. | |
| 5,391,258 A | 2/1995 | Brancaleoni et al. | |
| 5,407,526 A | 4/1995 | Danielson et al. | |
| 5,534,106 A | 7/1996 | Cote et al. | |
| 5,543,032 A | 8/1996 | Datta et al. | |
| 5,567,300 A | 10/1996 | Datta et al. | |
| 5,575,706 A | 11/1996 | Tsai et al. | |
| 5,770,095 A | 6/1998 | Sasaki et al. | |
| 5,783,489 A | 7/1998 | Kaufman et al. | |
| 5,807,165 A | 9/1998 | Uzoh et al. | 451/41 |
| 5,846,882 A | 12/1998 | Birang | |
| 5,866,031 A | 2/1999 | Carprio et al. | |
| 5,880,003 A | 3/1999 | Hayashi | |
| 5,883,762 A * | 3/1999 | Calhoun et al. | 205/119 |
| 5,897,375 A | 4/1999 | Watts et al. | |
| 5,911,619 A | 6/1999 | Uzoh et al. | 451/5 |
| 5,954,997 A | 9/1999 | Kaufman et al. | 252/79.1 |
| 6,001,730 A | 12/1999 | Farkas et al. | |
| 6,004,880 A | 12/1999 | Liu et al. | |
| 6,056,864 A | 5/2000 | Cheung | |
| 6,063,306 A | 5/2000 | Kaufman et al. | |
| 6,066,030 A | 5/2000 | Uzoh | |
| 6,077,412 A | 6/2000 | Ting et al. | |
| 6,083,840 A | 7/2000 | Mravic et al. | |
| 6,090,239 A | 7/2000 | Liu et al. | |
| 6,096,652 A | 8/2000 | Watts et al. | 438/692 |
| 6,103,096 A | 8/2000 | Datta | |
| 6,106,728 A | 8/2000 | Iida et al. | 210/743 |
| 6,117,775 A | 9/2000 | Kondo et al. | 438/690 |
| 6,117,783 A | 9/2000 | Small et al. | |
| 6,117,853 A | 9/2000 | Sakai et al. | |
| 6,126,798 A | 10/2000 | Reid et al. | |
| 6,126,853 A | 10/2000 | Kaufman et al. | 252/79.1 |
| 6,143,155 A | 11/2000 | Adams et al. | |
| 6,143,656 A | 11/2000 | Yang et al. | 438/687 |
| 6,153,043 A | 11/2000 | Edelstein et al. | |
| 6,171,352 B1 | 1/2001 | Lee et al. | |
| 6,176,992 B1 | 1/2001 | Talieh | |
| 6,190,237 B1 | 2/2001 | Huynh et al. | |
| 6,194,317 B1 | 2/2001 | Kaisaki et al. | 438/692 |
| 6,206,756 B1 | 3/2001 | Chopra et al. | 451/28 |
| 6,217,416 B1 | 4/2001 | Kaufman et al. | 451/41 |
| 6,218,305 B1 | 4/2001 | Hosali et al. | |
| 6,234,870 B1 | 5/2001 | Uzoh et al. | |
| 6,238,592 B1 | 5/2001 | Hardy et al. | |
| 6,248,222 B1 | 6/2001 | Wang | |
| 6,258,711 B1 | 7/2001 | Laursen et al. | |
| 6,258,721 B1 | 7/2001 | Li et al. | 438/693 |
| 6,273,786 B1 | 8/2001 | Chopra et al. | |
| 6,276,996 B1 | 8/2001 | Chopra | 451/41 |
| 6,280,598 B1 | 8/2001 | Barton et al. | 205/210 |
| 6,303,049 B1 | 10/2001 | Lee et al. | |
| 6,303,551 B1 | 10/2001 | Li et al. | |
| 6,310,019 B1 | 10/2001 | Kakizawa et al. | |
| 6,315,803 B1 | 11/2001 | Ina et al. | |
| 6,348,076 B1 | 2/2002 | Canaperi et al. | 51/309 |
| 6,354,916 B1 | 3/2002 | Uzoh et al. | 451/41 |
| 6,355,075 B1 | 3/2002 | Ina et al. | 51/308 |
| 6,355,153 B1 | 3/2002 | Uzoh et al. | 205/87 |
| 6,375,693 B1 | 4/2002 | Cote et al. | |
| 6,391,166 B1 | 5/2002 | Wang | |
| 6,395,152 B1 | 5/2002 | Wang et al. | |
| 6,402,925 B2 | 6/2002 | Talieh | |
| 6,413,388 B1 * | 7/2002 | Uzoh et al. | 204/224 R |
| 6,416,685 B1 | 7/2002 | Zhang et al. | 252/79.1 |
| 6,419,554 B2 | 7/2002 | Chopra et al. | |
| 6,428,721 B1 | 8/2002 | Ina et al. | |
| 6,429,133 B1 | 8/2002 | Chopra | |
| 6,440,186 B1 | 8/2002 | Sakai et al. | |
| 6,440,295 B1 | 8/2002 | Wang | |
| 6,447,371 B2 | 9/2002 | Brusic Kaufman et al. | |
| 6,447,668 B1 | 9/2002 | Wang | |
| 6,454,819 B1 | 9/2002 | Yano et al. | |
| 6,455,479 B1 | 9/2002 | Sahbari | |
| 6,508,952 B1 | 1/2003 | Lee et al. | |
| 6,541,384 B1 | 4/2003 | Sun et al. | |
| 6,551,935 B1 | 4/2003 | Sinha et al. | |
| 6,555,158 B1 | 4/2003 | Yoshio et al. | 427/97 |
| 6,562,719 B2 | 5/2003 | Kondo et al. | |
| 6,565,619 B1 | 5/2003 | Asano et al. | |
| 6,579,153 B2 | 6/2003 | Uchikura et al. | 451/41 |
| 6,582,579 B1 | 6/2003 | Uzoh | |
| 6,593,239 B2 | 7/2003 | Kaufman et al. | |
| 6,596,152 B2 | 7/2003 | Yang et al. | |
| 6,596,638 B1 | 7/2003 | Kondo et al. | |
| 6,602,112 B2 | 8/2003 | Tran et al. | |
| 6,605,537 B2 | 8/2003 | Bian et al. | |
| 6,616,976 B2 | 9/2003 | Montano et al. | |
| 6,620,215 B2 | 9/2003 | Li et al. | |
| 6,676,484 B2 | 1/2004 | Chopra | |
| 6,679,928 B2 | 1/2004 | Costas et al. | |
| 6,679,929 B2 | 1/2004 | Asano et al. | |
| 6,693,036 B1 | 2/2004 | Nogami et al. | |
| 6,699,299 B2 | 3/2004 | Sachan et al. | |
| 6,736,952 B2 | 5/2004 | Emesh et al. | |
| 6,821,409 B2 | 11/2004 | Basol et al. | |
| 6,852,630 B2 | 2/2005 | Basol et al. | |
| 6,867,136 B2 | 3/2005 | Basol et al. | |
| 6,893,476 B2 | 5/2005 | Siddiqui et al. | |
| 6,899,804 B2 | 5/2005 | Duboust et al. | |
| 6,902,659 B2 | 6/2005 | Talieh | |
| 6,943,112 B2 | 9/2005 | Basol et al. | |
| 6,946,066 B2 | 9/2005 | Basol et al. | |
| 2001/0016469 A1 | 8/2001 | Chopra | |
| 2001/0024878 A1 | 9/2001 | Nakamura | |
| 2001/0035354 A1 * | 11/2001 | Ashjaee et al. | 205/103 |
| 2001/0036746 A1 | 11/2001 | Sato et al. | 438/745 |
| 2001/0042690 A1 | 11/2001 | Talieh | |
| 2001/0052351 A1 | 12/2001 | Brown et al. | |
| 2002/0008036 A1 | 1/2002 | Wang | |
| 2002/0016064 A1 | 2/2002 | Komai et al. | |
| 2002/0016272 A1 | 2/2002 | Kakizawa et al. | |
| 2002/0040100 A1 | 4/2002 | Kume et al. | |
| 2002/0070126 A1 | 6/2002 | Sato et al. | 205/640 |
| 2002/0072309 A1 | 6/2002 | Sato et al. | 451/41 |
| 2002/0074230 A1 | 6/2002 | Basol | 205/93 |
| 2002/0088709 A1 | 7/2002 | Hongo et al. | |
| 2002/0096659 A1 | 7/2002 | Sakai et al. | |
| 2002/0104764 A1 | 8/2002 | Banerjee et al. | |
| 2002/0108861 A1 | 8/2002 | Emesh et al. | 205/81 |
| 2002/0108864 A1 | 8/2002 | Yang et al. | |
| 2002/0130049 A1 | 9/2002 | Chen et al. | |
| 2002/0139005 A1 | 10/2002 | Asano et al. | |
| 2002/0139055 A1 | 10/2002 | Asano et al. | |
| 2002/0160698 A1 | 10/2002 | Sato et al. | 451/67 |
| 2002/0182982 A1 | 12/2002 | Li et al. | |
| 2003/0038038 A1 | 2/2003 | Basol et al. | |

| | | | |
|---|---|---|---|
| 2003/0073311 A1 | 4/2003 | Levert et al. | |
| 2003/0073386 A1 | 4/2003 | Ma et al. | |
| 2003/0079415 A1 | 5/2003 | Ma et al. | |
| 2003/0083214 A1 | 5/2003 | Kakizawa et al. | |
| 2003/0104762 A1 | 6/2003 | Sato et al. | 451/9 |
| 2003/0113996 A1 | 6/2003 | Nogami et al. | 438/638 |
| 2003/0114004 A1 | 6/2003 | Sato et al. | 438/689 |
| 2003/0115475 A1 | 6/2003 | Russo et al. | |
| 2003/0116445 A1 | 6/2003 | Sun et al. | |
| 2003/0116446 A1* | 6/2003 | Duboust et al. | 205/682 |
| 2003/0119311 A1 | 6/2003 | Basol et al. | |
| 2003/0136055 A1 | 7/2003 | Li et al. | |
| 2003/0153184 A1 | 8/2003 | Wang et al. | |
| 2003/0170091 A1 | 9/2003 | Shomler et al. | |
| 2003/0178320 A1 | 9/2003 | Liu et al. | |
| 2003/0216045 A1 | 11/2003 | Wang et al. | |
| 2003/0234184 A1 | 12/2003 | Liu et al. | |
| 2004/0000491 A1* | 1/2004 | Kovarsky et al. | 205/291 |
| 2004/0026255 A1* | 2/2004 | Kovarsky et al. | 205/99 |
| 2004/0053499 A1 | 3/2004 | Liu et al. | |
| 2004/0144038 A1 | 7/2004 | Siddiqui | |
| 2004/0231994 A1 | 11/2004 | Basol et al. | |
| 2004/0248412 A1 | 12/2004 | Liu et al. | |
| 2005/0044803 A1 | 3/2005 | Siddiqui et al. | |
| 2005/0056537 A1 | 3/2005 | Chen et al. | |
| 2005/0076578 A1 | 4/2005 | Siddiqui et al. | |
| 2005/0076579 A1 | 4/2005 | Siddiqui et al. | |
| 2005/0079718 A1 | 4/2005 | Siddiqui et al. | |
| 2005/0079803 A1 | 4/2005 | Siddiqui et al. | |
| 2005/0145507 A1 | 7/2005 | Sun et al. | |
| 2005/0218010 A1 | 10/2005 | Wang et al. | |
| 2005/0227483 A1 | 10/2005 | Basol et al. | |
| 2006/0006074 A1 | 1/2006 | Liu et al. | |
| 2006/0009033 A1 | 1/2006 | Basol et al. | |
| 2006/0011485 A1 | 1/2006 | Basol et al. | |

FOREIGN PATENT DOCUMENTS

| | | |
|---|---|---|
| EP | 0 527 537 A1 | 2/1993 |
| EP | 0 699 782 | 3/1996 |
| EP | 0 811 665 A3 | 12/1997 |
| EP | 0 846 742 A2 | 6/1998 |
| EP | 1 170 761 | 3/2000 |
| EP | 1 103 346 A2 | 5/2001 |
| EP | 1 167 585 | 1/2002 |
| EP | 1 410 430 | 4/2004 |
| JP | 58-093886 | 6/1983 |
| JP | 58-093899 | 6/1983 |
| JP | 05-302199 | 11/1993 |
| JP | 06-158397 | 6/1994 |
| JP | 10-121297 | 5/1998 |
| JP | 2000-192298 | 7/2000 |
| JP | 2000-256898 | 9/2000 |
| JP | 01/77117 A1 | 3/2001 |
| SU | 1 618 538 A1 | 1/1991 |
| WO | WO 98/04646 A1 | 2/1998 |
| WO | WO 98/49723 | 11/1998 |
| WO | WO 99/46081 A1 | 9/1999 |
| WO | WO 99/46353 | 9/1999 |
| WO | WO 99/53532 A1 | 10/1999 |
| WO | 99/65072 | 12/1999 |
| WO | WO 99/65072 | 12/1999 |
| WO | WO 00/03426 | 1/2000 |
| WO | WO 00/26443 A2 | 5/2000 |
| WO | 00/55876 | 9/2000 |
| WO | WO 01/77241 A2 | 10/2001 |
| WO | WO 02/23616 A1 | 3/2002 |
| WO | 02/075804 | 9/2002 |
| WO | WO 02-075804 | 9/2002 |
| WO | WO 02/88229 A1 | 11/2002 |
| WO | WO 03/009361 | 1/2003 |
| WO | WO 03/060962 | 7/2003 |
| WO | WO 03/072672 | 9/2003 |
| WO | WO 03/087436 | 10/2003 |
| WO | WO 03/088316 | 10/2003 |

OTHER PUBLICATIONS

Contolini, et al., "Electrochemical Planarization of ULSI Copper," Solid State Technology (Jun. 1997).
International Search Report, dated Aug. 5, 2003 for PCT/US02/40754.
PCT Written Opinion for PCT/US03/06058, dated Feb. 13, 2004 (AMAT/5699-PC.02).
PCT Written Opinion for PCT/US02/04806, dated Mar. 9, 2004.
D. Landolt "Fundamental Aspects of Electropolishing" Mar. 18, 1996 pp. 1-11.
PCT International Search Report for PCT/US03/06058 dated Jun. 25, 2003.
PCT International Search Report for PCT/US02/04806 dated Apr. 1, 2003.
PCT International Preliminary Examination Report for PCT/US02/04806, dated Sep. 7, 2004.
PCT International Preliminary Examination Report for PCT/US03/06058, dated Sep. 7, 2004.
PCT International Search Report for PCT/US04/17691, dated Nov. 11, 2004.
PCT Written Opinion for PCT/US04/17691, dated Nov. 11, 2004.
D. Landolt, "Fundamental Aspects of Electropolishing", Mar. 18, 1996, pp. 1-11.
International Search Report for PCT/US02/04806 dated Apr. 1, 2003.
Nogami,"An Innovation to Integrate Porous Low-K Materials and Copper", InterConnect Japan 2001; Honeywell Seminar (Dec. 6, 2001) pp. 1-12.
Partial International Search Report for PCT/US02/40754 dated Apr. 28, 2003.
PCT IPRP and Written Opinion dated Dec. 22, 2005.
PCT Written Opinion for PCT/US02/0486, dated Mar. 9, 2004.
Besser et al., "Mechanical Strain Evolution in Cu/low K Interconnect Lines", Mat. Res. Soc. Symp. Proc. vol. 795, 2004 Materials Research Society, pp. U1.1.1-U1.1.6.
Chandrasekaran, et al., "Effects of CMP Process Conditions on Defect Generation in Low-k Materials", Journal of The Electrochemical Society, pp. G882-G889 (2004).
Chang, et al., "Microleveling Mechanisms and Applications of Electropolishing of Planarization of Copper Metallization", J. Vac. Sci. Technol. B 20 (5), Sep./Oct. 2002, pp. 2149-2152.
Chang, et al., "Superpolishing of Planarizing Copper Damascene Interconnects", Electrochemical and Solid-State Letters, pp. G72-G74 (2003).
Contolini, et al., "Electrochemical Planarization for Multilevel Metallization", J. Electrochem. Soc., vol. 141, No. 9, Sep. 1994, pp. 2503-2510.
Deshpande, et al., "Chemical Mechanical Planarization of Copper: Role of Oxidants and Inhibitors", Journal of The Electrochemical Society, pp. G788-G794 (2004).
Du, et al., "Effect of Hydrogen Peroxide on Oxidation of Copper in CMP Slurries Containing Glycine and Cu Ions", Electrochimica Acta, pp. 4505-4512 (2004).
Du, et al., Mechanism of Copper Removal During CMP in Acidic $H_2O_2$ Slurry, Journal of The Electrochemical Society, pp. G230-235 (2004).
Economikos, et al., "Integrated Electro-Chemical Mechanical Planarization (Ecmp) for Future Generation Device Technology", 2004 IEEE, pp. 233-235.
Goonetilleke, et al., Voltage-Induced Material Removal for Electrochemical Mechanical Planarization of Copper in Electrolytes Containing $NO_3^-$, Glycine, and $H_2O_2$, Electrochemical and Solid-State Letters, pp. G190-G193 (2005).
Hu, et al. "Copper Interconnection Integration and Reliability", Thin Solid State Films, pp. 84-92, (1995).
Jin-Hua, et al., "An XPS and BAW Sensor Study of the Structure and Real-Time Growth Behavious of a Complex Surface Film on Copper in Sodium Chloride Solutions (pH=9), Containing a Low Concentration of Benzotriazole", *Eletrochimica Acta*, vol. 43, Nos. 3-4, pp. 265-274, 1998.

Kaufman, et al., "Chemical-Mechanical Polishing for Fabricating Patterned W Metal Features as Chip Interconnects", *J. Electrochem. Soc.*, vol. 138, No. 11, Nov. 1991; The Electrochemical Society, Inc. pp. 3460-3465.

Kondo, et al., "Role of Additives for Copper Damascene Electrodeposition: Experimental Study on Inhibition and Acceleration Effects", *Journal of The Electrochemical Study Society*, pp. C250-C255 (2004).

Mansikkamaki, et al., "Inhibitive Effect of Benzotriazole on Copper Surfaces Studied by SECM", *Journal of the Electrochemical Society*, pp. B12-B16 (2005).

Padhi, et al., "Planarization of Copper Thin Films by Electropolishing in Phosphoric Acid for ULSI Applications", *Journal of the Electrochemical Society*, 150, pp. G10-G14 (2003).

Qafsaoui, et al., "Quantitative Characterization of Protective Films Grown on Copper in the Presence of Different Triazole Derivative Inhibitors", *Electrochimica Acta 47* (2002), pp. 4339-4346.

Steigerwald, et al., "Effect of Copper Ions in the Slurry on the Chemical-Mechanical Polish Rate of Titanium", *J. Electrochem. Soc.*, vol. 141, No. 12, Dec. 1994, pp. 3512-3516.

Tamilmani, et al., "Potential-pH Diagrams of Interest to Chemical Mechanical Planarization of Copper", *Journal of The Electrochemical Society*, V. 149, pp. G638-G642 (2002).

Tromans, et al., "Growth of Passivating CuBTA Films on Copper in Aqueous Chloride/Benzotriazole Solutions", *Electrochemical and Solid-State Letter*, V. 5, pp. B5-B8 (2002).

Wang, et al., "Inhibition Effect of AC-Treated, Mixed Self-Assembled Film of Phenylthiourea and 1-Dodecanethiol on Copper Corrosion", *Journal of The Electrochemical Society*, pp. B11-B15 (2004).

Selemion™ internet search retrieved from http://www.agc.co.jp/english/chemicals/ion-maku/selemion/sele.htm.

\* cited by examiner

FIG. 2

HYDROGEN BUBBLE REDUCTION ON THE CATHODE USING DOUBLE-CELL DESIGNS

CROSS-REFERENCE TO RELATED APPLICATIONS

This application is a continuation-in-part of U.S. patent application Ser. No. 10/032,275, filed Dec. 21, 2001, now U.S. Pat. No. 6,899,804, entitled "Polishing Composition and Treatment for Electrolytic Chemical Mechanical Polishing." Each of the aforementioned related patent applications is herein incorporated by reference.

BACKGROUND OF THE INVENTION

1. Field of the Invention

Embodiments of the present invention relate to electrolytic chemical mechanical polishing. More particularly, embodiments of the present invention relate to an electrolyte solution and apparatus for copper removal and a method for removing copper ions therefrom.

2. Background of the Related Art

Reliably producing sub-half micron and smaller features is one of the key technologies for the next generation of very large scale integration (VLSI) and ultra large-scale integration (ULSI) of semiconductor devices. However, as the limits of circuit technology are pushed, the shrinking dimensions of interconnects in VLSI and ULSI technology have placed additional demands on the processing capabilities. Reliable and repeatable formation of these interconnects is important to VLSI and ULSI success and to the continued effort to increase circuit density and improve process yield.

Multilevel interconnects are formed using sequential material deposition and material removal techniques on a substrate (or wafer) surface to form features therein. As layers of materials are sequentially deposited and removed, the uppermost surface of the substrate may become non-planar across its surface and require planarization prior to further processing. Planarization or "polishing" is a process where material is removed from the surface of the substrate to form a generally even, planar surface. Planarization is useful in removing excess deposited material and removing undesired surface topography and surface defects, such as rough surfaces, agglomerated materials, crystal lattice damage, scratches, and contaminated layers or materials to provide an even surface for subsequent lithography and processing.

Electrochemical mechanical polishing (ECMP) is one method of planarizing a surface of a substrate. ECMP removes conductive materials from a substrate surface by electrochemical dissolution while polishing the substrate with a reduced mechanical abrasion compared to conventional chemical mechanical planarization (CMP) processes. A typical ECMP system includes a substrate support, an anode (generally the substrate), and cathode disposed within an electrolyte containment basin. In operation, metal atoms on a surface of a substrate are ionized by an electrical current from a source of potential, such as a battery or other voltage source connected to the two electrodes. The metal ions dissolve into the surrounding electrolyte solution at a rate proportional to the electric current. The metal ions from the substrate (anode) either plate the electrode (cathode), fall out of the solution as a precipitate, or remain in the solution. The destiny of the metal ions depends greatly on the chemistry of the metals and the solution.

Due to the push for high tool throughput, processed wafers per hour, the. goal in ECMP type processes is to maximize the electrochemical dissolution rate of the desired material from the surface of the substrate. The dissolution current (i.e., dissolution rate) is limited by some fundamental aspects of the electrochemical process. It is important to understand, in electrochemical processes such as ECMP, that charge neutrality in the electrolyte must be conserved (in a non-transient process or process step) and thus for every metal ion removed from the anode (surface of the substrate), a corresponding number of electrons are accepted at the cathode by a positive ion(s). At low to moderate electrochemical currents, the process will typically cause the metal ions in the electrolyte solution to be plated onto the cathode surface. Although, if the rate at which the metal ions are removed from the anode surface is increased, the reaction at the cathode can become limited since the fluid near the surface of the cathode becomes depleted of the metal ions. The electrochemical reaction, therefore, becomes rate limited by the process of diffusion of the metal ions across the depleted region around the cathode. Since the current is limited by the diffusion process of the ions, this state is commonly known as the limiting current ($i_L$). The depleted region near the surface of the cathode is commonly known as the diffusion boundary layer, or Nernst diffusion boundary layer, which is related to the hydrodynamic boundary layer. If the applied voltage, or driven current, is then further increased, a secondary reaction such as gas evolution, can occur at the cathode and/or anode, depending on the chemistry, applied voltage, hydrodynamics, etc., which then allows the electrical current to be further increased. As an example, in acidic chemistries, e.g., baths with a low pH, it is common for the hydrogen ions to be reduced at the cathode, thus causing hydrogen gas to be evolved. A discussion of electrochemical processes such as described here can be found in Chapters 1-11 of "Electrochemical Methods," by Alan J. Bard published by John Wiley & Sons, 1980.

One problem associated with the gas evolution is that the generated gas forms bubbles that can become trapped against the surface of the anode, cathode, flow diffusers, membranes, and/or some intermediate surfaces in an electrochemical cell. The trapped gas, due to its insulating properties, tends to adversely affect the electrochemical process. In one case, the bubbles can cause an increase in the total cell electrical resistance, since the bubbles tend to decrease the area in which the current can pass through membranes, anode surface or the cathode surface, due to their insulating properties. In another case, where the anode surface is face down in the electrochemical bath, the evolved gas can tend to rest on the substrate or pad surfaces preventing dissolution from these covered areas. The covered surfaces can, thus, leave unpolished or non-uniform polished areas on the substrate, leaving defects that can affect subsequent semiconductor processes.

There is a need, therefore, for various apparatus designs and chemistries which will prevent or reduce the amount of gas generated during the ECMP process and reduce the detrimental effect of the gas bubbles on the ECMP process.

SUMMARY OF THE INVENTION

The embodiments of the present invention generally provide an electrochemical mechanical polishing system that reduces the number of defects found on the substrate surface after polishing. An exemplary electrochemical apparatus includes a physical barrier that prevents any trapped gas or gas generated during processing from residing in areas that can cause defects on the substrate. The process can be aided by the addition of various chemical components to the electrolyte that tend to reduce the gas generation at the cathode surface during the ECMP anodic dissolution process.

Specifically, the present invention contains two adjacent chambers and two separate electrolyte containing fluids, which are separated by a membrane. The membrane is selected such that it prevents trapped gas or gas generated during processing from being transferred into the opposing chamber. The membrane may be frustroconical in shape, to allow the gas bubbles to flow to the outer edge of the membrane and be evacuated by a vent. A power source that causes the anodic dissolution of material from the substrate surface is connected to the substrate disposed in the first chamber, and a counter electrode is disposed in the second chamber. The substrate support urges the substrate against a polishing medium to improve contact between the substrate and the power source connection. Optionally, abrasive particles can be added to promote convention CMP type polishing while the anodic dissolution process is being completed on the substrate surface to enhance the material removal rate.

In another aspect of the invention, the electrolyte which is in communication with the cathode may contain a concentration of metal ions to reduce the gas generation at the cathode surface. The membrane disposed between the two chambers is selected such that it prevents the metal ions and any gas bubbles from diffusing into the chamber that contains the substrate.

In yet another aspect of the invention, the first chamber, which contains the substrate, also contains a first cathode member and the second chamber contains a second cathode member. The first and second cathode members are electrically connected to one terminal of the power source and the substrate is connected to the opposing terminal of the power source. The membrane disposed between the first and second chambers prevents gas diffusion across the membrane surface.

Embodiments of the invention further provide a method for removing a conductive layer from the surface of the substrate by use of a electrochemical mechanical polishing process. One aspect of the current invention generally consists of connecting the substrate to one terminal of a power source, disposing the substrate in a first electrolyte, connecting a counter electrode to the other terminal of a power source, disposing the counter electrode in a second electrolyte, disposing a membrane between the substrate and the counter electrode such that the membrane is in contact with both electrolytes, applying a bias between the substrate and the counter electrode, and removing materials from the surface of the substrate disposed in the electrolyte.

In another embodiment, the invention further provides a method for removing a conductive layer from the surface of the substrate by use of an electrochemical mechanical polishing process. One aspect of the current invention generally consists of connecting the substrate to one terminal of a power source, disposing the substrate in a first electrolyte, connecting a counter electrode to the other terminal of a power source, disposing the counter electrode in a second electrolyte, disposing a membrane between the substrate and the counter electrode such that the membrane is in contact with both electrolytes, applying pressure to the substrate and a polishing medium by use of a polishing head, providing relative motion between the substrate and the polishing medium by mechanical means, applying a bias between the substrate and the counter electrode, and removing materials from the surface of the substrate disposed in the electrolyte.

In yet another embodiment, the invention further provides a method for removing a conductive layer from the surface of the substrate by use of an electrochemical mechanical polishing process. One aspect of the current invention generally consists of connecting the substrate to one terminal of a power source, disposing the substrate in a first electrolyte, connecting a counter electrode to the other terminal of a power source, disposing the counter electrode in a second electrolyte, disposing a membrane between the substrate and the counter electrode such that the membrane is in contact with both electrolytes, connecting a second counter electrode to the counter electrode, disposing the second counter electrode in the first electrolyte, applying a bias between the substrate and the counter electrodes, and removing materials from the surface of the substrate disposed in the electrolyte.

BRIEF DESCRIPTION OF THE DRAWINGS

So that the manner in which the above recited aspects of the invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and, therefore, are not to be considered limiting of its scope, for the invention may admit to other equally effective embodiments.

FIG. 2 is a partial section view of another embodiment of a polishing process station 305 useful for practicing the methods described herein.

DETAILED DESCRIPTION OF THE PREFERRED EMBODIMENT

Figure 1:
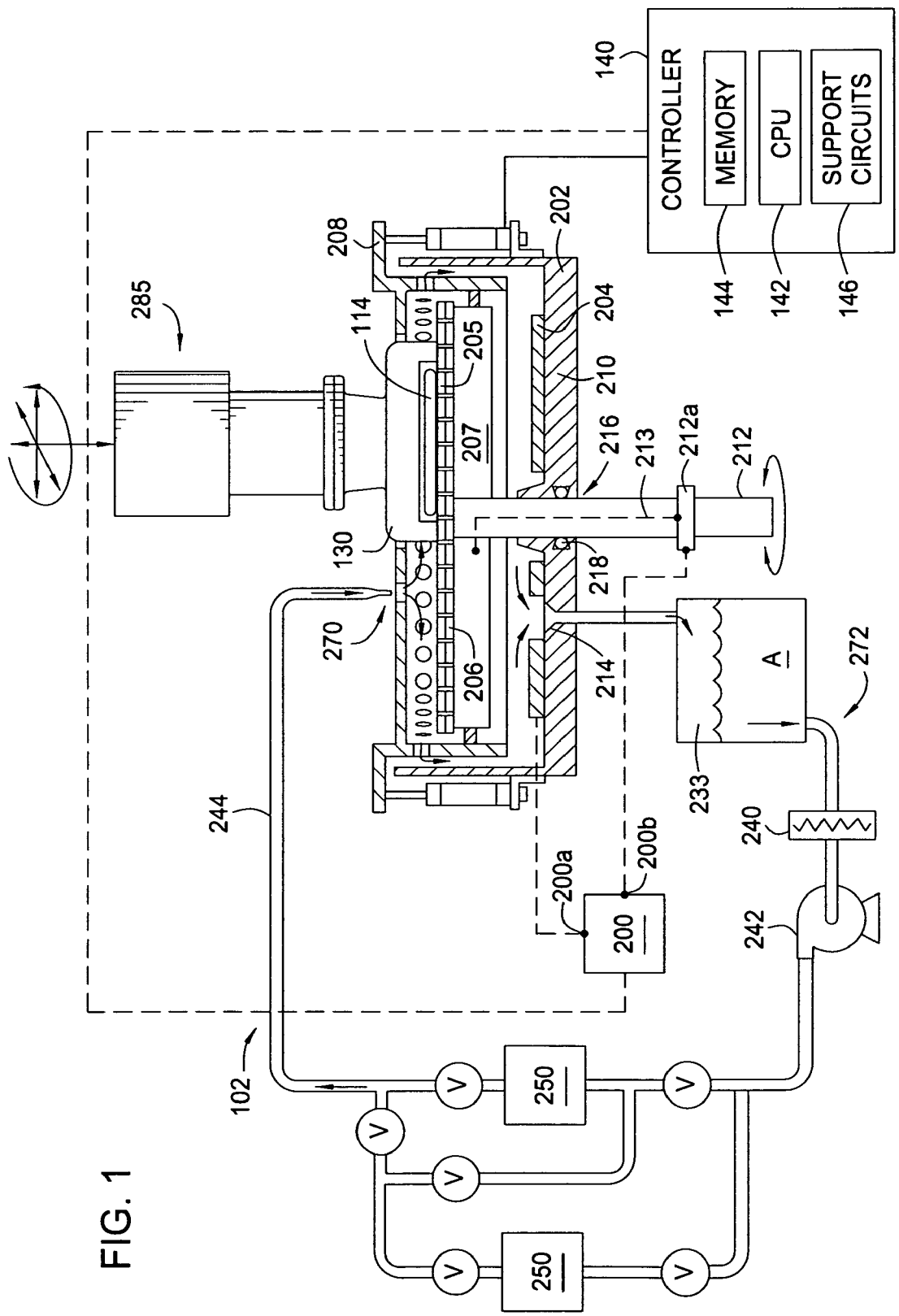
FIG. 1 is a partial section view of a polishing process station 102 useful for practicing the methods described herein.

The words and phrases used herein should be given their ordinary and customary meaning in the art by one skilled in the art unless otherwise further defined. Chemical polishing should be broadly construed and includes, but is not limited to, planarizing a substrate surface using chemical activity. Electropolishing should be broadly construed and includes, but is not limited to, planarizing a substrate by the application of electrochemical activity. Electrochemical mechanical polishing (ECMP) should be broadly construed and includes, but is not limited to, planarizing a substrate by the application of electrochemical activity, mechanical activity, or a combination of both electrochemical and mechanical activity to remove material from a substrate surface. Anodic dissolution should be broadly construed and includes, but is not limited to, the application of an anodic bias to a substrate directly or indirectly which results in the removal of conductive material from a substrate surface and into a surrounding electrolyte.

General ECMP Processing Chamber

An electrolyte A that can planarize copper is provided. The electrolyte A has a pH of about 2 to about 10. Although the electrolyte A is particularly useful for removing copper, it is believed the electrolyte A also may be used for the removal of other conductive materials, such as aluminum, platinum, tungsten, tantalum, cobalt, titanium, gold, and silver, for example.

The electrolyte A is an aqueous solution that may include phosphate systems, derivatives thereof, and mixtures thereof. Preferably, the electrolyte A includes a phosphate system, such as ammonium dihydrogen phosphate ($NH_4H_2PO_4$), diammonium hydrogen phosphate (($NH_4)_2HPO_4$), phosphoric acid, or a mixture thereof, in amounts of about 2 to about 30 percent by weight in the total volume of solution. In another aspect, the electrolyte A includes dihydrogen phosphate and/or diammonium hydrogen phosphate in amounts of about 15 to about 25 percent by weight in the total volume of solution. In yet another aspect, the electrolyte A includes dihydrogen phosphate and/or diammonium hydrogen phosphate in an amount of about 20 percent by weight in the total volume of solution.

One or more pH adjusting agents is preferably added to the to the electrolyte A to achieve a pH between about 2 and about 10, and preferably a pH between about 4 and about 6. The amount of pH adjusting agent can vary as the concentration of the other components are varied in different formulations, but in general the total solution may include up to about 70 wt. % of the one or more pH adjusting agents, but preferably between about 0.2% and about 25% by volume. Different compounds may provide different pH levels for a given concentration, for example, the composition may include between about 0.1% and about 10% by volume of a base, such as potassium hydroxide, ammonium hydroxide, or combinations thereof, to provide the desired pH level. The one or more pH adjusting agents can be chosen from a class of organic acids, for example, carboxylic acids, such as acetic acid, citric acid, oxalic acid, phosphate-containing components including phosphoric acid, ammonium phosphates, potassium phosphates, and combinations thereof, or a combination thereof. Inorganic acids, such as strong acids including sulfuric acid, nitric acid, and combinations thereof, may also be used in the electrolyte A.

The electrolyte A may further include one or more additives that adsorb onto the surface of the substrate. Additives may include levelers, brighteners, inhibitors, suppressors, enhancers, and surfactants, for example. Certain additives may decrease the ionization rate of the metal atoms, thereby inhibiting the dissolution process, whereas other additives may increase the dissolution rate of the removed metal ions, thereby increasing the removal rate of the metal. Various additives may also provide a finished, shiny substrate surface.

The additives may be present in the electrolyte A in concentrations up to about 15% by weight in volume of total solution. Useful additives include one or more chelating agents having amine groups, amide groups, carboxylate groups, dicarboxylate groups, tri-carboxylate groups, or combinations thereof. For example, the chelating agents may include tetraethylenepentamine, triethylenetetramine, diethylenetriamine, ethylenediamine, amino acids, ammonium oxalate, ammonia, ammonium citrate, citric acid, and ammonium succinate.

In any of the embodiments described herein, corrosion inhibitors can be added to reduce the oxidation or corrosion of metal surfaces by forming a layer of material which minimizes the chemical interaction between the substrate surface and the surrounding electrolyte. The layer of material formed by the corrosion inhibitors thus tend to suppress or minimize the electrochemical current from the substrate surface to limit electrochemical deposition and/or dissolution. The corrosion inhibitors may include between about 0.001% and about 5.0%, preferably between about 0.2% and about 0.4% by weight of organic compounds from one or more azole groups. Examples of organic compounds having azole groups include benzotriazole, mercaptobenzotriazole, 5-methyl-1-benzotriazole, and combinations thereof. Other suitable corrosion inhibitors include film forming agents that are cyclic compounds, for example, imidazole, benzimidazole, triazole, and combinations thereof. Derivatives of benzotriazole, imidazole, benzimidazole, triazole, with hydroxy, amino, imino, carboxy, mercapto, nitro and alkyl substituted groups may also be used as corrosion inhibitors. Other corrosion inhibitor include urea and thiourea among others.

The electrolyte A may further include one or more oxidizers to enhance the removal or removal rate of the conductive material from the substrate surface. For example suitable oxidizers include peroxy compounds, e.g., compounds that may dissociate through hydroxy radicals, such as hydrogen peroxide and its adducts including urea hydrogen peroxide, percarbonates, and organic peroxides including, for example, alkyl peroxides, cyclical or aryl peroxides, benzoyl peroxides, peracetic acid, and di-t-butyl peroxide. Sulfates and sulfate derivatives, such as monpersulfates and dipersulfates may also be used including for example, ammonium peroxydisulfate, potassium peroxydisulfate, ammonium persulfate, and potassium persulfate. Salts of peroxy compounds, such as sodium percarbonate and sodium peroxide may also be used.

The electrolyte A may also include one or more surface finish enhancing and/or removal rate enhancing materials including abrasive particles, one or more oxidizers, and combinations thereof. Abrasive particles may be used to improve the removal rate or removal of conductive materials from the substrate surface during polishing. Abrasive particles may comprise up to about 35 wt. % of the electrolyte A during processing. Preferably, a concentration between about 0.001 wt. % and about 5 wt. % of abrasive particles may be used in the electrolyte A.

Suitable abrasives particles include inorganic abrasives, polymeric abrasives, and combinations thereof. Inorganic abrasive particles that may be used in the electrolyte include, but are not limited to, silica, alumina, zirconium oxide, titanium oxide, cerium oxide, germania, or any other abrasives of metal oxides, known or unknown. The typical abrasive particle size used in one embodiment of the current invention is generally between about 20 nm and about 1000 nm. Generally, suitable inorganic abrasives have a Mohs hardness of greater than 6, although the invention contemplates the use of abrasives having a lower Mohs hardness value.

The polymer abrasives described herein may also be referred to as "organic polymer particle abrasives", "organic abrasives" or "organic particles." The polymeric abrasives may comprise abrasive polymeric materials. Examples of polymeric abrasives materials include polymethylmethacrylate, polymethyl acrylate, polystyrene, polymethacrylonitrile, and combinations thereof.

The balance or remainder of the electrolyte A described above is a solvent, such as a polar solvent, including water, preferably deionized water, and organic solvents, for example, alcohols or glycols.

Although the electrolyte of this invention is thought to be useful with ECMP, electropolishing, and chemical polishing systems, the electrolyte may be used particularly to advantage in an ECMP process station. A typical ECMP process station is a modified cell on an Electra® Cu Integrated ECP system, available from Applied Materials, Inc. of Santa Clara, Calif. A typical ECMP process station may also be a modified platen on an Reflexion®/Mirra® Integrated CMP system, both available from Applied Materials, Inc. of Santa Clara, Calif.

FIG. 1 illustrates a partial section view of a polishing station 102. As shown, the polishing station 102 generally includes a basin 202, a first electrode 204, a second electrode 207, a cover 208, and a substrate support 130. The substrate support 130 provides support for a substrate 114 disposed thereon. Although the polishing station 102 depicts a substrate "face down" configuration, the electrolyte A may also be used to advantage within a processing chamber utilizing a substrate "face up" configuration. In this alternative configuration, the substrate would rest with its plated side up and the polishing medium 205 and perforated disc 206 would be disposed on the plated surface of the substrate 114.

Referring to FIG. 1, the first electrode 204 is disposed within the basin 202 and is a conventional electrode having a reactive bias applied thereto to act as a cathode. The first electrode 204 may be made of the metal to be removed from the substrate 114, which may consist of aluminum, copper, gold, silver, or tungsten, for example. Accordingly, for copper removal, the first electrode 204 can consist of a copper containing material or any material that the deposited metal adheres well to and that is not attacked by the chemistry (e.g. Pt, Pt coated Ti, Ti, etc.).

The second electrode 207 is also disposed within the basin 202 and may take the form of a polishing medium 205 supported on a lower surface by a perforated disc 206. The polishing medium 205, which is in electrical contact with the second electrode 207 and thus power source 200, is used to apply a uniform bias to the substrate surface without the use of a conventional bias application apparatus, such as an edge contact. The polishing medium 205 can be a pad, web, or belt of material that is conductive or includes a partially conductive surface for contact with the substrate surface during processing. The conductive surface of the polishing medium 205 may include materials, such as conductive polymers, polymer composites with conductive materials, conductive metals, conductive fillers, conductive doping materials, or combinations thereof. The partially conductive surface of the polishing medium 205 may also be a composite of a conductive polishing material disposed in a conventional polishing material, such as a polymer-noble metal hybrid material like a platinum-polymer hybrid material. The partially conductive surface of the polishing medium 205 is described in more detail in the co-pending provisional U.S. patent application Ser. No. 60/326,263, entitled "Conductive Polishing Media for Electrochemical Mechanical Polishing", filed on Oct. 1, 2001, which is incorporated by reference herein. The use of a polishing medium 205 with a conductive surface is generally preferred over the use of a conventional substrate contacting means such as discrete substrate contacts, e.g. an edge contact, backside contact, etc., but should not be considered limiting to the scope of the present invention. A discrete contact design is described in more detail in the U.S. Pat. No. 6,299,741, entitled "Advanced Electrolytic Polish (AEP) Assisted Metal Wafer Planarization Method and Apparatus", issued on Oct. 9, 2001 to Sun et al. and the co-pending U.S. patent application Ser. No. 10/98,796, entitled "Method and Apparatus for Substrate Polishing", filed on Mar. 3, 2002, which are incorporated by reference herein. An example of another embodiment of the polishing medium 205 utilizing conventional polishing material (non-conductive) with discrete contacts are more fully disclosed in the U.S. patent application Ser. No. 10/211,626, filed on Aug. 2, 2002, which is incorporated by reference herein to the extent not inconsistent with the claimed aspects and disclosure herein.

The basin 202 can be a bowl shaped member made of a plastic such as fluoropolymers, TEFLON®, perfluoroalkoxy (PFA), polyethylene (PE), sulfonated polyphenylether sulfones (PES), Halar® coated metal, or other materials that are compatible with electroplating and electropolishing chemistries. The basin 202 has a bottom 210 that includes an aperture 216 and a drain 214. The aperture 216 is generally disposed in the center of the bottom 210 and allows a shaft 212 to pass there-through. A seal 218 is disposed between the aperture 216 and the shaft 212 and allows the shaft 212 to rotate while preventing fluids disposed in the basin 202 from passing through the aperture 216.

Since the second electrode 207 can be rotated by use of mechanical hardware (not shown) connected to the shaft 212, the electrical connection between the power source 200 and the second electrode 207 can made through the rotating electrical connection 212a. The lead 213 is routed through the shaft 212 and is connected to the rotating electrical connection 212a disposed below the basin 202. The rotating electrical connection 212a facilitates continuous electrical connection between the power source 200 and second electrode 207 as it rotates. The lead 213 may be wires, tapes or other conductors compatible with process fluids or having a covering or coating that protects the leads from the process fluids. The rotating electrical connection 212a, generally described in the art as a slip ring, can be purchased from such manufacturers as IDM Electronics LTD, Reading Berkshire, England, a division of Kaydon Corporation, Ann Arbor, Mich.

The substrate 114 and the polishing medium 205 are moved relative to each other to provide a polishing motion. The polishing motion generally comprises at least one motion defined by an orbital, rotary, linear or curvilinear motion, or combinations thereof, among other motions. The polishing motion may be achieved by moving either or both of the substrate support 130 and/or the polishing medium 205. The substrate support 130 may be stationary or driven to provide at least a portion of the relative motion between the polishing medium 205 and the substrate 114 held by the polishing substrate support 130. In the embodiment depicted in FIG. 1, or any of the other embodiments described herein, the substrate support 130 is coupled to a drive system 285. The drive system 285 can generally move the substrate support 130 with at least a rotary, orbital, sweep motion, or combinations thereof. In one embodiment the basin 204 is rotated at a velocity from about 3 to about 100 rpm, and the polishing head 202 is rotated at a velocity from about 5 to about 200 rpm and also moved linearly at a velocity of about 5 to about 25 centimeters per second in a direction radial to the basin 204. The preferred ranges for a 200 mm diameter substrate are a basin 204 rotational velocity of about 5 to about 40 rpm and a polishing head 202 rotational velocity of about 7 to about 100 rpm and a linear (e.g., radial) velocity of about 10 centimeters per second. The preferred ranges for a 300 mm diameter substrate are a basin 204 rotational velocity of about 5 to about 20 rpm and a polishing head 202 rotational velocity of about 7 to about 50 rpm and a linear (e.g., radial) velocity of about 10 centimeters per second. In one embodiment of the present invention the basin 204's diameter can range from about 17 to about 30 inches and the distance the polishing head 202 moves along the radius of the basin 204 can be from about 0.1 to about 2 inches.

The electrolyte A is disposed in the basin 202 and generally flows through the drain 214 into a fluid recycle system 272. The fluid recycle system 272 includes a reservoir 233, filter 240, recycle pump 242, and one or more ion exchange systems 250. The electrolyte A flowing into the fluid recycle system 272 is collected in the reservoir 233. The pump 242 transfers the electrolyte A from the reservoir 233 through a supply line 244 to the nozzle 270 where the electrolyte A is recycled to the polishing station 102. The filter 240 may be disposed between the reservoir 233 and the nozzle 270 to remove particles and agglomerated material that may have collected in the electrolyte A. Optionally, the filter 240 may be disposed between the pump 242 and the ion exchange system 250.

The one or more ion exchange systems 250 remove copper ions from the electrolyte A by a physical or chemical adsorption process. The ion exchange system 250 includes any ion exchange resin capable of capturing copper from the electrolyte A without affecting the electrolytic properties of the electrolyte A. The ion exchange resin for use in copper ECMP, one embodiment of the current invention, has a strong affinity for copper ions. Thus, copper ions are removed from the electrolyte A as the electrolyte A flows through the ion exchange system 250. After a period of use, the resin may be regenerated by flowing a regeneration fluid such as an aqueous solution of ammonium hydroxide or acid through the ion exchange system 250. The use of ion exchange membrane(s) and aspects of the electrolyte are further described in the co-pending U.S. patent application Ser. No. 10/032,275, entitled "Electrolyte and Treatment for Electrolytic Chemical Mechanical Polishing", filed on Dec. 21, 2001, which is incorporated by reference herein.

Various configurations of the ion exchange systems 250 may be employed. For example, two or more ion exchange systems 250 may be situated in parallel or series, depending on the needs and demands of the processing system. The exact nature of piping, valving, and pumps is well known to one skilled in the art of ion-exchange technology, and is determined by the volume of the electrolyte A, the frequency of plating operations, the composition of the substrates, and the required purity of the electrolyte A, for example.

Still referring to FIG. 1, a substrate 114 is disposed on the substrate support 130 which may be a polishing head used in a chemical mechanical planarization process as shown. The substrate support 130 typically applies a pressure in the range of about 0.1 psi to about 6 psi to the substrate surface to be electrochemically and mechanically polished. On the substrate support 130, the substrate 114 is exposed to the electrolyte A and contacted with the second electrode 207. A bias from a power source 200 is then applied to both electrodes 204 and 207. The bias is generally provided to produce anodic dissolution of the conductive material from the surface of the substrates at a current density up to about 100 milliamps/cm$^2$ for substrates up to about 300 mm in diameter. For example, between about 0.01 and about 40 milliamps/cm$^2$ for a 200 mm substrate. The bias may be varied in power and polarity depending upon the user requirements in removing material from the substrate surface. The bias may also be applied by an electrical pulse modulation technique, which applies a constant current density or voltage for a first time period, then applies a constant reverse current density or voltage for a second time period, and repeats the first and second steps, as is described in co-pending U.S. patent application Ser. No. 09/450,937, entitled "Method And Apparatus For Electrochemical Mechanical Planarization", filed on Nov. 29, 1999, which is incorporated by reference herein.

To facilitate control of the polishing process, a controller 140 comprising a central processing unit (CPU) 142, memory 144, and support circuits 146, is connected to the Polishing station 102. The CPU 142 may be one of any form of computer processors that are used in industrial settings for controlling various electrical and mechanical components. The memory 144 is connected to the CPU 142, and may be one or more of a readily available memory such as random access memory (RAM), read only memory (ROM), floppy disk, hard disk, or any other form of digital storage, local or remote. Software instructions and data can be coded and stored within the memory 144 for instructing the CPU 142. The support circuits 146 are also connected to the CPU 142 for supporting the processor CPU 142 in a conventional manner. The support circuits 146 may include cache, power supplies, clock circuits, input/output circuitry, subsystems, and the like.

As the process proceeds, the electrolyte A is cycled through the fluid recycle system 272 to remove copper ions. First, the electrolyte A solution flows through the drain 214 of the basin 202 to the reservoir 233. The pump 242 transfers the electrolyte A solution through the ion exchange system 250 and through the nozzle 270 for injection into the basin 202.

In yet another embodiment, the electrolyte A is delivered to substrate 114 from a source of fresh chemistry (not shown), flows past the surface of the substrate 114, and is then collected in a waste tank or drain (not shown). In this "single pass" embodiment, the electrolyte is not re-circulated and thus should only contact the substrate once. This embodiment has a benefit since it removes the need for the expensive recycling equipment, the ion exchange membrane(s), and possibly the need to filter the chemistry after each cycle, but may increase the process waste.

EXAMPLES

Electrolyte A

The following non-limiting examples are provided to further illustrate embodiments of the invention. However, the examples are not intended to be all inclusive and are not intended to limit the scope of the invention described herein.

Example 1

A copper plated wafer was polished and planarized using the following electrolyte A within a modified cell on a Reflection® system, available from Applied Materials, Inc. of Santa Clara, Calif.
  about 6% by volume phosphoric acid;
  about 2% by volume ethylenediamine;
  about 2% by weight ammonium citrate;
  about 0.3% by weight benzotriazole;
  between about 2% and about 6% by volume of potassium hydroxide to provide a pH of about 5;
  about 0.45% by volume of hydrogen peroxide; and
  deionized water.

Example 2

A copper plated wafer was polished and planarized using the following electrolyte A within a modified cell on a Reflection® system, available from Applied Materials, Inc. of Santa Clara, Calif.

about 6% by volume phosphoric acid;
about 2% by volume ethylenediamine;
about 2% by weight ammonium citrate;
about 0.3% by weight benzotriazole;
between about 2% and about 6% by volume of potassium hydroxide to provide a pH of about 5;
about 0.45% by volume of hydrogen peroxide;
about 0.15% by weight of silica ($SiO_2$) abrasive particles; and
deionized water.

Example 3

A copper plated wafer was polished and planarized using the following electrolyte A within a modified cell on a Reflection® system, available from Applied Materials, Inc. of Santa Clara, Calif.
about 6% by volume phosphoric acid;
about 2% by volume ethylenediamine;
about 2% by weight ammonium citrate;
about 0.3% by weight benzotriazole;
between about 2% and about 6% by volume of potassium hydroxide to provide a pH of about 6;
about 0.1% by weight of silica ($SiO_2$) abrasive particles; and deionized water.

Example 4

A copper plated substrate was polished and planarized using the following polishing composition within a modified cell on a Reflection® system, available from Applied Materials, Inc. of Santa Clara, Calif.
about 6% by volume phosphoric acid;
about 2% by volume ethylenediamine;
about 2% by weight ammonium citrate;
about 0.3% by weight benzotriazole;
between about 2% and about 6% by volume of potassium hydroxide to provide a pH of about 5; and
deionized water.

The electrolyte solution of each example provided a high rate of removal, good planarization, and good substrate surface finish.

First Embodiment

One goal of the present invention is to reduce and/or prevent the gas generated during the ECMP process from adversely affecting the ECMP process results. This goal can be met by either preventing gas generation, reducing the amount of gas generated during processing, or isolating the gas generation source from the electrochemically active areas of the chamber (e.g. substrate surface, polishing media, etc.). Any gas trapped on the horizontal substrate 114 (anode surface), polishing medium 205 or perforated disc 206 surfaces (or pores) can cause defects on the substrate due to the insulating properties of the gas bubbles. Defects can be created due to the following: 1) creation of an area of electrochemical inactivity caused by entrapment of the insulating bubbles, 2) causing an increase in the cell's electrical resistance, thus reducing the control of the ECMP process and possibly limiting the power which the power source 200 can deliver, or 3) causing electric field line non-uniformity due to trapped gas on intermediate surfaces in the ECMP chamber causing a non-uniform process result. The areas of inactivity on the surface of the substrate will cause problems in the subsequent processes (e.g., lithography, etc.) due to incomplete processing or raised portions of unpolished (unetched) metal. The loss of process control due to varying cell resistance or uneven regions of electrical resistance, caused by the presence of a non-uniform distribution of bubbles on the polishing medium 205 and/or perforated disc 206 surfaces, anode surfaces, or cathode surfaces, can cause the substrate to substrate process results to vary, possibly causing device yield problems.

Due to the various process control and other ECMP process benefits, the metal ion concentration (e.g., copper ions, etc.) in the electrolyte A is purposely minimized by use of ion exchange membranes or by a non-recirculating "single pass" design. Therefore, the diffusion boundary layer region around the cathode surface, in the above described embodiment (FIG. 1), will become depleted of metal ions even at moderate to low ECMP currents. Therefore, in order to generate the desired dissolution current, using the above described chemistry, the ECMP process often relies heavily on the secondary reactions at the cathode, such as the reduction of hydrogen ions, to support the driven dissolution current. The reaction of hydrogen ions at the cathode surface thus tends to generate gas bubbles.

Figure 2:
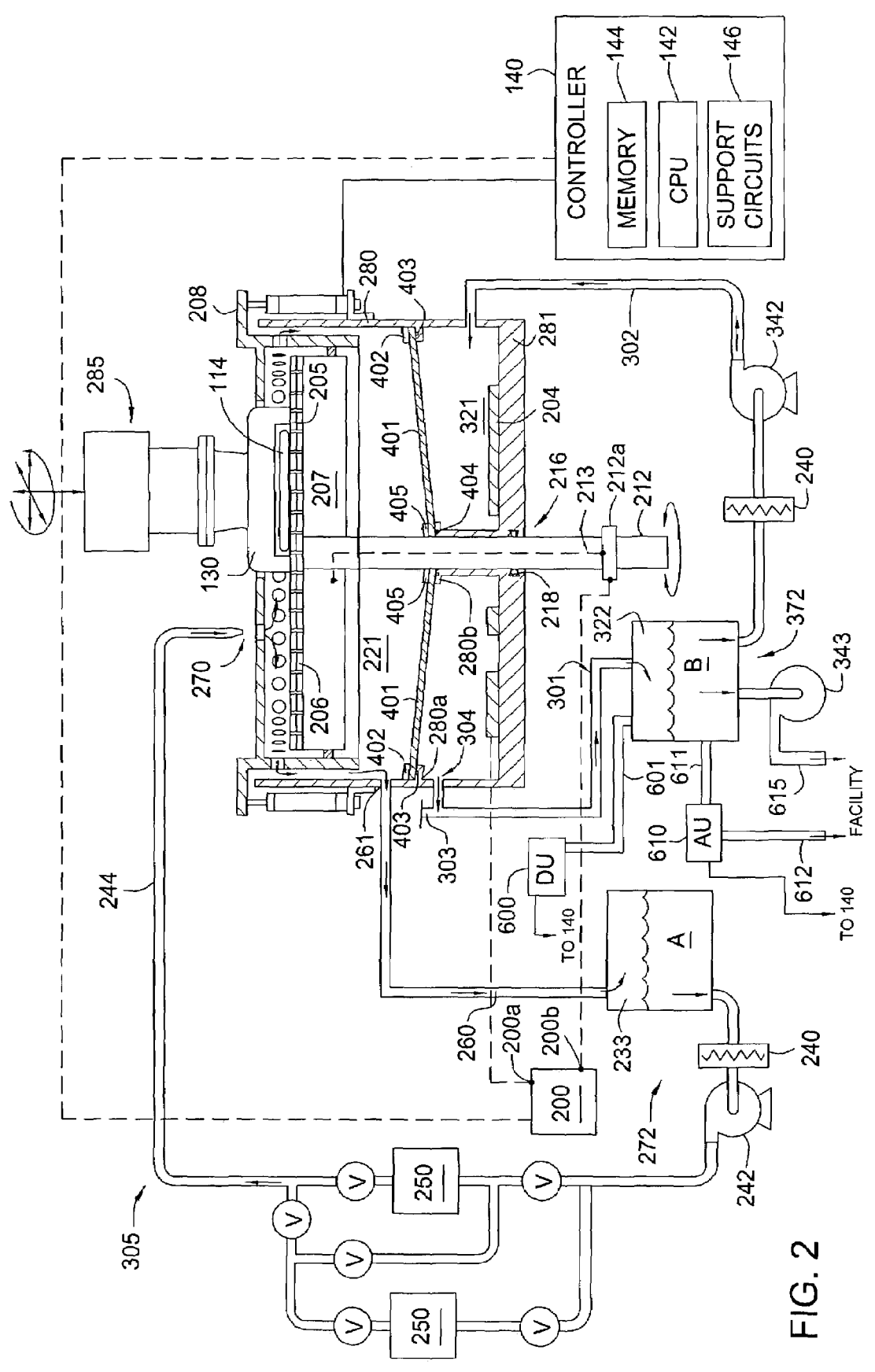

FIG. 2 illustrates a partial sectional view of an embodiment of the current invention describing the polishing station 305. Some unchanged elements have been imported into FIG. 2 from FIG. 1 and are shown with like numerals for clarity. As shown, the polishing station 305 generally includes a lower basin 280, a first electrode 204, a second electrode 207, a cover 208, and a substrate support 130 (polishing head). The substrate support 130 provides support for a substrate 114 disposed thereon. Although the polishing station 305 depicts a substrate 114 "face down" configuration, the substrate 114 could also be in a "face up" configuration. In this alternative configuration, the substrate 114 would rest with its plating side up and the polishing medium 205 and perforated disc 206 would be disposed on the plating surface of the substrate 114.

The lower basin 280 described in FIG. 2 is separated into two major fluid containing areas, the analyte chamber 221 and the cathalyte chamber 321 which are separated by a membrane 401. The membrane 401 is a semi-permeable membrane which is sealed to the base of chamber base 281 through the use of seals 403 and 404 and clamps 402 and 405. The clamps 402 and 405 are used to bias the membrane 401 against the seals resting on the membrane mounting surfaces 280a and 280b, of the chamber base 281. The seals formed between the membrane 401 and the seals 403 and 404 thus prevent fluid in the analyte chamber 221 or cathalyte chamber 321 from leaking around the membrane and into the other respective chambers. The hardware used to bias the clamps against the membrane are not shown for clarity.

The electrolyte A is disposed in the analyte chamber 221 and generally flows through the analyte drain 261 into a fluid recycle system 272 through the outlet drain connection 260. The fluid recycle system 272 includes a reservoir 233, filter 240, recycle pump 242, and one or more ion exchange systems 250. The electrolyte A flowing into the fluid recycle system 272 is collected in the reservoir 233. The pump 242 transfers the electrolyte A from the reservoir 233 through a supply line 244 to the nozzle 270 where the electrolyte A is recycled to the polishing station 305. The filter 240 may be disposed between the reservoir 233 and the pump 242 to remove particles and agglomerated material that may have collected in the electrolyte A. Optionally, the filter 240 may be disposed between the pump 242 and the ion exchange system 250.

In yet another embodiment, the electrolyte A is delivered to substrate 114 from a source of fresh chemistry (not shown), flows past the surface of the substrate 114, and is then collected in a waste tank or drain (not shown). In this embodiment the electrolyte is not re-circulated and thus should only contact the substrate once ("single pass" design). This embodiment has a benefit since it removes the need for the expensive recycling equipment, ion exchange membrane(s), and possibly the need to filter the chemistry after each cycle, but may increase the process waste.

Further, the electrolyte B is disposed in the cathalyte chamber 321 generally flows through the cathalyte drain 304 into a second fluid recycling system 372 through the outlet drain connection 301. The fluid second recycling system 372 includes a bath 322, filter 240, and a cathalyte pump 342. The electrolyte B flowing into the second fluid recycle system 372 is collected in the bath 322. The cathalyte pump 342 transfers the electrolyte B from the bath 322 through a supply line 302 into one end of the cathalyte chamber 321, then through the cathalyte chamber 321, and out an opposing end through the outlet drain connection 301. A filter 240 may be disposed between the bath 322 and the cathalyte pump 342 to remove particles and agglomerated material that may have collected in the electrolyte B. Optionally, the filter 240 may also be disposed in the supply line 302 after the cathalyte pump 342.

A vent 303 is incorporated into the outlet drain connection 301 to allow any trapped gas in the cathalyte chamber to be purged. While the vent 303 is only schematically shown in FIG. 2, it envisioned that the vent 303 can be configured such that end of the vent 303 is open to the atmosphere and thus any trapped gas in the fluid can escape. To prevent loss of electrolyte B, the vertical height of the exposed end of the tube must be high enough to assure that the fluid pressure in the fluid return line 301 doesn't allow the fluid to overflow out of the vent 303 tube. Optionally, a hydrophobic membrane that completely seals the top most surface of the vent 303 line may be used, which thus prevents fluid from leaking out of the end of the vent 303, but will allow the exchange of trapped gas in the solution with the atmosphere. Hydrophobic membranes of this type can be purchased from companies such as Millipore Corporation, Billerica, Mass. It should be noted that the transfer of trapped gas across the hydrophobic membrane can be enhanced by connecting up the atmospheric side of the membrane to a vacuum generating source (not shown).

The membrane 401 which separates the analyte chamber 221 and the cathalyte chamber 321, has been specially selected since the membrane only allows the transfer of hydrogen ions ($H^+$) or/and hydroxide ions ($OH^-$). The membrane 401, for example, can be made from a material such as Nafion® made by DuPont Corporation of Wilmington, Del., a Neosepta™ membrane made by Tokuyama Incorporated of Tokyo, Japan, or a Selemion™ homogeneous membrane made by Asahi Glass Company USA of Charlotte, N.C., or combination thereof. Embodiments of the present invention may include the use of a membrane which allows ion passage through the membrane in a single direction or in both directions. The preferred design in the current embodiment would allow the transfer of ions in both directions. The membrane 401 must be strong enough to support any pressure differential between the analyte and cathalyte chambers and may optionally be supported by a compatible structural support member. Due to possible material agglomeration, life time issues, and other possible damaging actions, the membrane can be a consumable component.

In an embodiment of the invention, the membrane 401 is frustroconical in shape, with the lower surface at the center being lower than the outer edge (shown in FIG. 2). The frustroconical surface is at an angle that will allow the bubbles to flow to the outer edge and into the vent 303. This desired angle is dependent on the fluid properties, fluid agitation, and the size of the bubbles generated. The shape thus tends to prevent bubbles from not resting on any membrane surface adjacent to the cathode, and thus affect electric field uniformity and dissolution uniformity.

Due to the presence of the ion exchange membrane (membrane 401), that only allows the passage of hydrogen ions ($H^+$) and/or hydroxide ions ($OH^-$), the electrolyte B will have an equivalent pH (hydrogen ion and/or hydroxide ion concentration) as the electrolyte A, e.g., about 2 to about 10. The electrolyte B preferably contains all of the same major components as the electrolyte A for economy of scale and process control concerns, e.g., user familiarity, similar life time of components, etc.

Generally, the electrolyte B need not contain chelating agents, additives and/or abrasive particles to affect the deposited film on the cathode, but in some cases it may helpful to include one or more additives and/or chelating agents that adsorb onto the first electrode 204 (cathode). Additives may include levelers, brighteners, inhibitors, suppressors, enhancers, and surfactants, for example. Certain additives may decrease the reaction rate of the metal ions at the first electrode 204, thereby inhibiting the process, whereas other additives may increase the reaction rate of the metal ions at the first electrode acting as a cathode, thus it is possible that either type of additive may have some benefit to the ECMP process.

The additives may be present in the electrolyte B in concentrations up to about 15% by weight of total solution. Useful additives include one or more chelating agents having amine groups, amide groups, carboxylate groups, dicarboxylate groups, tri-carboxylate groups, or combinations thereof. For example, the chelating agents may include tetraethylenepentamine, triethylenetetramine, diethylenetriamine, ethylenediamine, amino acids, ammonium oxalate, ammonia, ammonium citrate, citric acid, and ammonium succinate. Corrosion inhibitors (organic compounds with azole groups) may also be added such as benzotriazole (BTA), for example.

The major difference between the electrolyte A and the electrolyte B is the addition of metal ions to the electrolyte B. If the desired metal ion is copper, a common method used to add copper ions to the bath (i.e., volume of electrolyte) is by the addition of a copper salt. An example of a common purchasable form of a copper salt is copper sulfate pentahydrate ($CuSO_4$—$5H_2O$). Copper sulfate ($CuSO_4$) is added to the electrolyte B bath to a concentration between 0.05 to 1.2 Molar (M), and preferably between 0.2 and 0.9 Molar (M). The addition of the copper ions to the cathalyte loop increases the concentration of metal ions near the surface of the first electrode 204, thus the current at which the reaction at the cathode becomes limited due to the metal ion depletion is increased due to the increase in concentration of metal ions in the bulk electrolyte. The increase in concentration of the electrolyte will generally have a proportional effect on the magnitude of the limiting current. However, if the applied voltage or driven current is then further increased, a secondary reaction such as gas evolution can occur at the cathode, allowing the electrical current to be further increased above the limiting current.

In this embodiment the desired concentration of metal ions in the bath is such that the electrolyte B will support the dissolution rate and no gas will be generated. It is possible that due to the use of high dissolution currents or a lack of adequate agitation around the electrochemically active surfaces, an amount of gas could be generated. However, the amount of gas generated will be less than if the low metal ion containing electrolyte had been used. Fluid agitation can also be added to the current embodiment to reduce the size of the depletion region by improving the chamber hydrodynamics and thus increase the limiting current. It will be noted that the thickness of the diffusion layer is strongly dependent on the hydrodynamic boundary layer.

The balance or remainder of the electrolyte B described above is a solvent, such as a polar solvent, including water, preferably deionized water, and organic solvents, for example, alcohols or glycols.

Figure 3B:
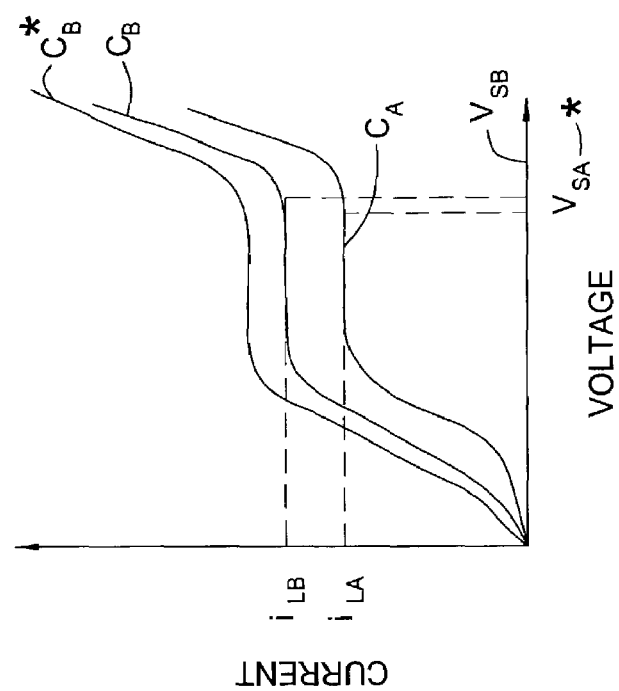
FIG. 3B is graphical representation of the effect of concentration and fluid agitation versus distance from the electrode at a constant ECMP process current.
Figure 3A:
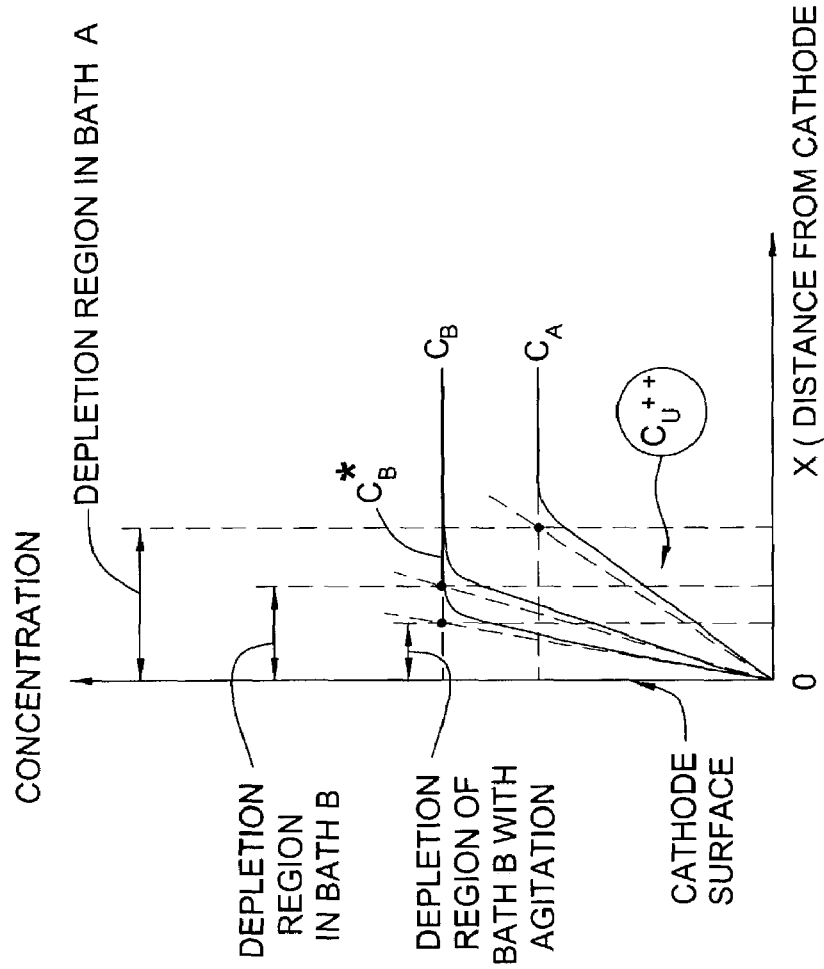
FIG. 3A is graphical representation of the affect of variations in chemistry on the limiting current.

FIGS. 3A and 3B illustrate the general effect of changing metal ion concentration and fluid agitation on the current versus potential curves and the concentration versus distance from the cathode surface curves. The drawings are only meant to be graphical representations to highlight the effect of the various embodiments of the current invention versus a standard or typical electrochemical process. FIG. 3A generally depicts some general metal ion concentration profiles as a function of distance from the cathode surface (shown as the X-axis) where the surface of the cathode can be found at X=0. One will note that vertical axis (C-axis) depicts an increasing concentration of metal ions in the electrolyte. Therefore, the limiting current concentration at the surface of the cathode, which is approximately zero, corresponds to a point on the graph shown in FIG. 3A of X=0 and C=0. The curves $C_A$ and $C_B$ describe typical shapes of concentration versus distance curves during electrochemical processing where $C_A$ is some lower concentration of metal ions than $C_B$. The horizontal regions of the curves $C_B$ and $C_A$, which are a distance away from the cathode surface, generally depicts the average concentration of metal ions in the bulk electrolyte (average concentration in the electrolyte). The depletion region as graphically shown highlights the effect that higher bulk metal ion concentration ($C_B > C_A$) will generally lower the diffusion boundary layer thickness ($\delta_A > \delta_B$) when similar hydrodynamic and polishing currents are used in the same processing cell. FIG. 3A also depicts the general effect of fluid agitation on the diffusion boundary layer thickness, where the increased agitation, shown as curve $C_B^*$, decreases the hydrodynamic boundary layer thickness further, assuming that both cases are within the same type of fluid dynamic regime (i.e., turbulent or laminar flow).

FIG. 3B generally depicts the effect of concentration ($C_B^* = C_B > C_A$) and agitation ($C_B^*$ has increased fluid agitation over $C_B$) on the voltage and current characteristics of general cathodic reactions, where the vertical axis is current (i-axis) and the horizontal axis is voltage (V-axis). As shown the limiting current ($i_L$) increases as the metal ion concentration increases for a constant current and fluid dynamic conditions. FIG. 3B also generally depicts the increase in limiting current ($i_L$) as the hydrodynamic boundary layer is reduced by increased fluid agitation around the cathode, as shown in curves $C_B^*$ and $C_B$. Finally, FIG. 3B depicts the on-set of the secondary reaction (e.g., $2H^+ + 2e^- \rightarrow H_2$, etc.) at voltages $V_s$, which depends on the applied voltage (or current), chemistry, fluid dynamic effects, etc., created when the electrochemical process is run at increased applied voltages (or currents).

During processing, since the metal ions added to the electrolyte B are plated onto the surface of the cathode, and the membrane 401 only permits hydrogen ions to be passed between the analyte chamber 221 and cathalyte chamber 321, the concentration of metal ions in the cathalyte loop will decrease as each successive process step has been completed. To counteract the dropping metal ion concentration in the electrolyte B, metal ions must be added to the bath to bring the bath within a predetermined range of metal ion concentration. Water ($H_2O$) and the sulfate ions ($SO_4^{2-}$), for example, will increase in concentration in the electrolyte B as metal ion containing material is added. Therefore, rather than only adding metal ions to the bath, all of the chemical components of the electrolyte B need to be added (or dosed) periodically to keep the desired chemical concentration within a desired process range. To maintain a constant volume in the electrolyte B in the cathalyte chamber 321, when a volume of desired material is dosed into the bath 322 an equivalent volume of "old" material must be removed from the bath 322 by use of the drain pump 343. The waste material can then be transferred to the user's facility waste system or reclaim system (not shown).

Further, to assure that the concentration and thus the ECMP process is repeatable, the metal ion concentration in the bath 322 must be continuously sampled and analyzed to assure that the concentration is within the user defined process window. If the concentration of the various components in the electrolyte fall below a predetermined threshold, more metal containing solution and other chemical components in the bath can be added to the electrolyte chemistry. The frequency of sampling of the electrolyte B depends directly on the chemistry, the tolerance for variation in the chemical composition during processing, and the substrate through-put through the polishing station 305 multiplied by the amount of metal removed from the substrate (often measured in Amp-hours). A common method for analyzing the metal concentration in the electrolyte B is by titration, which can be done manually or automatically by the use of various commercially available systems and/or use of the controller 140. Since additives and other inorganic and organic components can be used, it is possible that other analysis techniques may be required. Commercially available autotitration and organic analysis systems can be purchased from companies like ECI Technology Inc., based in East Rutherford, N.J. The use of automatic analysis techniques on similar electrolytes is further described in the U.S. Pat. No. 6,267,853, entitled "Electro-chemical Deposition System", issued on Jul. 30, 2001, which is incorporated by reference herein. A typical analysis system is commonly utilized on the Electra® Cu Integrated ECP system, available from Applied Materials, Inc. of Santa Clara, Calif.

An automated dosing system as described above may comprise, as shown in FIG. 2, a controller 140 to initiate command signals to operate an analyzer unit 610 (inorganic and organic analyzers) in order to generate data on the chemical concentrations in the bath. The information from the chemical analyzers contained in the analyzer unit 610 is then communicated back to the control system 140. The control system 140 processes the information and transmits signals which include user-defined chemical dosage parameters to the dosing control unit 600. The received information is then used to provide real-time adjustments by operating one or more of the valves housed in the dosing control unit 600, thereby maintaining a desired, and preferably constant, chemical composition of the electrolyte throughout the ECMP process. The control system 140 also removes a volume of electrolyte equivalent to the amount dosed into the bath 322 by uses of the drain pump 343, to assure that the fluid level remains constant in the system. The fluid removed by the drain pump 343 and the waste electrolyte from the analyzer unit 610 are sent to the facility waste system (not shown) via the outlet lines 615 and 612, respectively.

The typical ECMP processing conditions such as applied electrical bias, pressure applied to the substrate by the substrate support 130, and typical electrical pulse modulation techniques are described in the embodiments shown above.

In one embodiment of the current invention the membrane 401 could be made from a liquid permeable membrane which prevents any bubbles from being transferred from one side of the membrane to the other. In this configuration the composition of the chemistry between the electrolyte A and the electrolyte B need not be different, since the membrane is fluid permeable. The membrane may designed such that it is frustoconical in shape such that any bubbles will be carried to the outer edge of the membrane and evacuated by the vent 303 connected to the cathalyte drain 304. In this embodiment the membrane 401 could be made of common filter membrane material such as a 0.2 μm polyvinylidene fluoride (PVDF), polyethylene (PE), or PTFE membrane material purchased from Millipore Corporation, Billerica, Mass., a polyethylene (PE) porous plastic sheets made by Porex Corporation, Fairburn, Ga., a porous ceramic-membrane made by NGK Insulators, LTD., Nagoya, Japan or some other equivalent porous material that will not be attacked by the chemistry and blocks the passage of bubbles. This configuration can reduce the complexity of the system by removing the need to maintain two separate electrolytes, while preventing bubbles in the cathalyte chamber from causing ECMP process problems.

Second Embodiment

Figure 4:
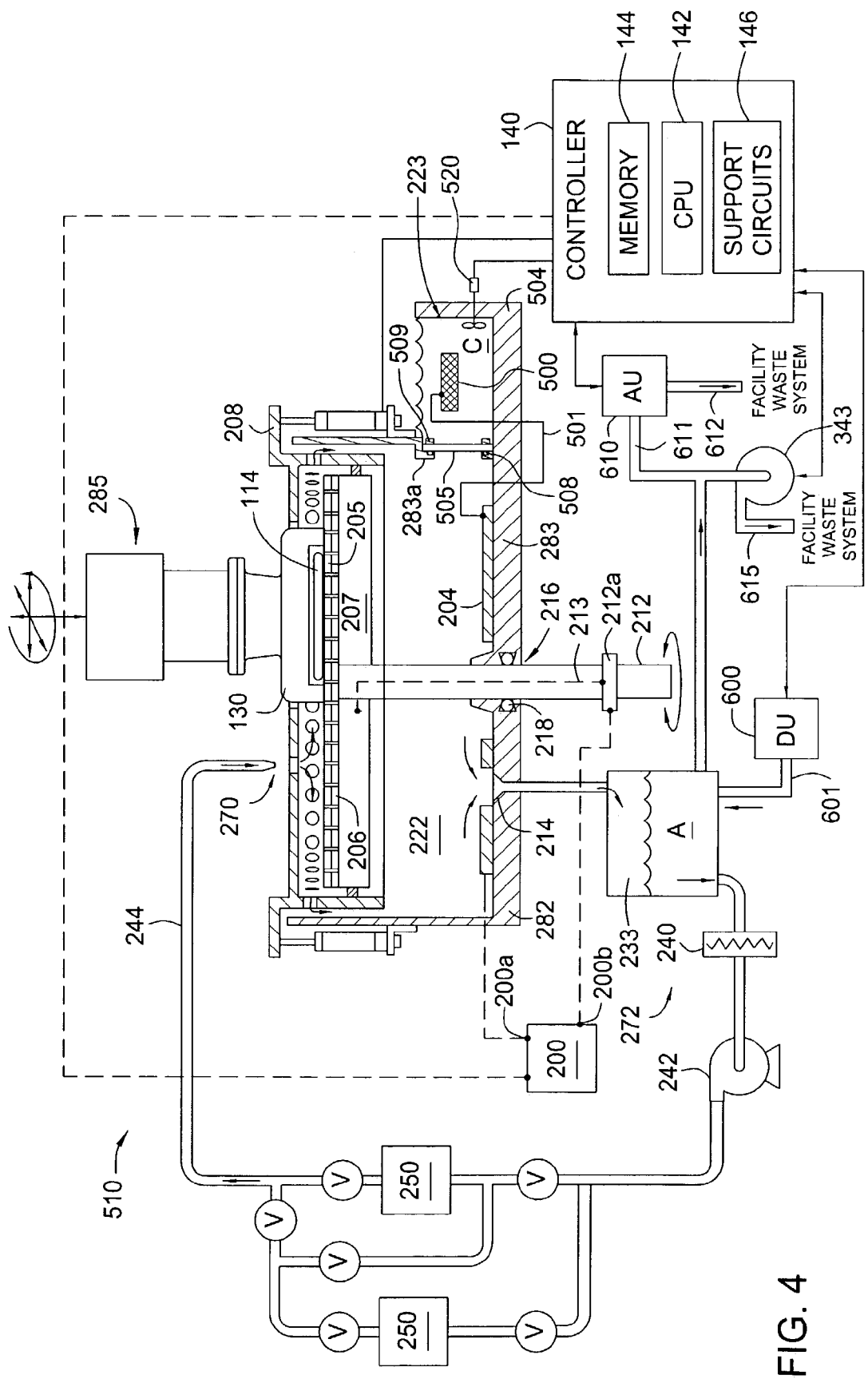
FIG. 4 is a partial section view of another embodiment of a polishing process station 510 useful for practicing the methods described herein.

FIG. 4 highlights another embodiment of the present invention where the embodiment described in FIG. 1 has been modified by adding an adjacent auxiliary chamber 223 and hardware to the polishing station 510. For clarity one will note that some unchanged elements have been imported into FIG. 4 from FIG. 1 and are shown with like numerals for clarity. As shown, the polishing station 510 generally includes a basin 282, a second electrode 207, a third electrode 500, a cathode electrical connection 501, a cover 208, substrate support 130, a membrane 505, a processing tank 504, and an optional first electrode 204. The substrate support 130 provides support for a substrate 114 disposed thereon. Although the polishing station 510 depicts a substrate 114 "face down" configuration, the electrolyte A may also be used to advantage within a processing chamber utilizing a substrate 114 "face up" configuration. In this alternative configuration, the substrate 114 would rest with its plated side up and the polishing media 205 and perforated disc 206 would be disposed on the plated surface of the substrate 114.

The membrane 505 which separates the process chamber 222 and the auxiliary chamber 223, is specially designed such that the membrane only allows hydrogen ions ($H^+$) to pass through the membrane in one direction. In the present embodiment the membrane will allow hydrogen ions to pass from the process chamber 222 to the auxiliary chamber 223. For example, the membrane 505 can be made from an ionic anion permeable membrane such as a Neosepta ACM, APS, or AM1 membranes made by Tokuyama Incorporated of Tokyo, Japan, or a Selemion™ APS membrane made by Asahi Glass Company USA of Charlotte, N.C., or combination thereof. The membrane 505 is sealed to the base of chamber base 283 through the use of seal 508 and clamps 509. The clamps 509 are used to compress the membrane 505 against the seal 508 resting on the membrane mounting surface 283a, of the chamber base 283. The seal formed between the membrane 505 and the seals 508 thus prevent fluid in the process chamber 222 or auxiliary chamber 223 from leaking into the other respective chamber. For clarity the hardware used to bias the clamps against the membrane are not shown. Due to the presence of the "sealed" directional ion permeable membrane 505 (from process chamber to auxiliary chamber 223), none of the generated gas at the third electrode 500 can migrate into the process chamber 222 and become trapped in undesirable areas.

In embodiment shown in FIG. 4, the electrode 204 is retained in the process chamber 222 to control and maintain a uniform electric field, and thus maintain a uniform electrochemical material removal across the surface of the substrate. The use of electrode 204 is generally not preferred due to the possible generation of gas that can affect the ECMP process. It is important to note that non-uniformities in the electric field between the cathode(s) and anode can cause a non-uniform ECMP polishing profile across the substrate surface. Non-uniformity in the ECMP polishing profile can cause variations in the polishing process, defects on the substrate, or an uneven polishing profile, and thus could lead to possible process yield issues. In this invention the polishing medium 205 and the perforated disc 206 tend to even out the electric field variations by causing a significant electrical resistance drop across them due to a relatively small open cross-sectional area, due to the size and density of the pores and/or holes, which the current can be conducted through. This type of protection may not always be enough to meet the desired uniformity requirements, thus in one embodiment the first electrode 204 is disposed in the process chamber 222 to dampen this effect. If the use of electrode 204 is not required to enhance the ECMP process, another embodiment of the present invention could consist of an isolated cathode design which would consist of version of polishing station 510, where the third electrode 500 would be directly connected to the terminal 200a, and the electrode 204 and the cathode electrical connection 501 would be removed.

The electrolyte A disposed in the process chamber 222 generally flows through the drain 214 into a fluid recycle system 272. The fluid recycle system 272 includes a reservoir 233, filter 240, recycle pump 242, and one or more ion exchange systems 250. The electrolyte A flowing into the fluid recycle system 272 is collected in the reservoir 233. The pump 242 transfers the electrolyte A from the reservoir 233 through a supply line 244 to the nozzle 270 where the electrolyte A is recycled to the polishing station 510. The filter 240 may be disposed between the reservoir 233 and the pump 242 to remove particles and agglomerated material that may have collected in the electrolyte A. Optionally, the filter 240 may be disposed between the pump 242 and the ion exchange system 250.

It is contemplated, but not shown in FIG. 4, that one embodiment of the present invention could contain a fluid recirculation system to move the electrolyte C through the auxiliary chamber 223 past the third electrode 500. In general the contemplated design would contain similar components as those contained in the fluid recycle system 272 described above. A fluid agitation device 520 is optionally added to the auxiliary chamber 223 to minimize compositional variations in the bath and improve hydrodynamics at the electrochemically active surfaces (the membrane 505 and the third electrode 500). The fluid agitation device 520 can be some form of mechanical agitation device (e.g., stirring device, etc.) or ultrasonic, megasonic or similar type actuator commonly known in the art.

Referring to FIG. 4, the first electrode 204 is disposed within the basin 202 and the third electrode 500 disposed in the auxiliary chamber 223 are conventional electrodes having a reactive bias applied thereto via the first terminal 200a of power source 200 (controlled by the controller 140) to act as a cathode. The first electrode 204 and third electrode 500 are connected via a cathode electrical connection 501 to thus effectively increase the cathode area. The first electrode 204 and/or the third electrode 500 may be made of the metal to be removed from the substrate 114, which may consist of aluminum, copper, gold, silver, or tungsten, for example. Accordingly, for copper removal, the first electrode 204 and/or the third electrode 500 can consist of a copper containing material or any material that the deposited metal (removed by dissolution at the anode (e.g., copper)) adheres well to and that is not attacked by the chemistry (e.g. Pt, Pt coated Ti, Ti, etc.).

The second electrode 207 is also disposed within the basin 282 and may take the form of a polishing medium 205 supported on a lower surface by a perforated disc 206. The elements of the second electrode 207, polishing medium 205 and the perforated disc 206 are described above.

The typical ECMP processing conditions such as applied electrical bias, pressure applied to the substrate by the substrate support 130, and typical electrical pulse modulation techniques is described in the embodiments shown above.

The electrolyte C that is used in this embodiment preferably has an equivalent electrolyte as electrolyte A except that the hydrogen ion concentration in the electrolyte has been increased by the addition, of an acid. The choice of acids depends on the choice of chemistries, but in the phosphate systems as described above the use of phosphoric acid or sulfuric acid is preferred. The electrolyte C has a pH less than about 5, and preferably between about 0.1 and about 3. Also, generally the electrolyte C need not contain additives, chelating agents and/or abrasive particles to affect the deposited film on the cathode, but in some cases it may helpful to include one or more additives that enhance the reaction at the third electrode 500 (cathode). Additives may include levelers, brighteners, inhibitors, suppressors, enhancers, and surfactants, for example. Certain additives may decrease the reaction rate of the metal ions at the third electrode 500, thereby inhibiting process, whereas other additives may increase the reaction rate of the metal ions at the first electrode, thus it is possible that either type may have some benefit to the ECMP process.

One goal of the present invention is to reduce and/or prevent the gas generated during the ECMP process from adversely affecting the process results. This goal is met in the embodiment shown in FIG. 4, by reducing the gas generated on the first electrode 204 in the process chamber by allowing a portion of ECMP polishing current, thus generated gas, to be evolved by the third electrode 500 in the gas impermeable auxiliary chamber 223. The addition of hydrogen ions to electrolyte C will increase the concentration of ions near the surface of the third electrode 500 (cathode), thus the current at which the reaction at third electrode 500 becomes limited due to ion depletion is increased. The increase in concentration of the electrolyte will generally have a proportional effect on the magnitude of the secondary reaction current.

During processing, since the hydrogen gas will be evolved from the electrolyte C due to the cathodic reaction and the membrane 505 only permits hydrogen ions to pass from the process chamber 222 to the auxiliary chamber 223, the concentration of hydrogen ions in the process chamber 222 will decrease as each successive ECMP process step has been completed. To counteract this problem, some acidic solution may be added to the bath to bring it within a predetermined pH range.

Further, a problem that arises due to the addition of extra solution is that other chemical components which are contained in the acidic solution, such as water ($H_2O$) and other ions (e.g., phosphate ions ($PO_3^-$), etc.), increase in concentration as more material is dosed into the bath. Therefore, all of the chemical components of electrolyte A may need to be added into the bath periodically to keep each of the desired chemical concentrations within a desired process ranges. To maintain the volume of the electrolyte A in the process chamber 222 at a constant level, when a volume of material is dosed into the auxiliary chamber, an equivalent volume of material is removed from it by use of the drain pump 343. The waste is generally transferred to the user's facility waste system or reclaim system (not shown).

Further, to assure that the concentration and thus the ECMP process is repeatable, the hydrogen ion concentration in the process chamber 222 must be continuously sampled and analyzed to maintain the concentration within the user defined process window. If the concentration of the various components in the electrolyte fall below a predetermined threshold, more acid containing solution and other chemical components in the bath can be added to the electrolyte chemistry. The frequency of sampling of the electrolyte A depends directly on the chemistry, the tolerance for variation in the chemical composition during processing, and the substrate through-put through the polishing station 510 multiplied by amount metal removed from the substrate (often measured in Amp-hours). A common method for analyzing the hydrogen ion concentration in the electrolyte A is by titration, which can be done manually or automatically by the use of various commercially available systems and use of the controller 140. If additives and other inorganic and organic components are used it is possible that other analysis techniques may be required. Commercially available systems such as autotitration and organic analysis tools (e.g., CVS, etc.) can be purchased from companies like ECI Technology Inc. The use of automatic analysis techniques on similar electrolytes is further described in the U.S. Pat. No. 6,267,853, entitled "Electro-chemical Deposition System", issued on Jul. 30, 2001, which is incorporated by reference herein. A typical analysis system is commonly utilized on the Electra® Cu Integrated ECP system, available from Applied Materials, Inc. of Santa Clara, Calif.

An automated dosing system as described above might occur by the following process. The controller 140 initiates command signals to operate the analyzer unit 610 (inorganic and organic analyzers) in order to generate data on the chemical concentrations in the bath. The information from the chemical analyzers contained in the analyzer unit 610 is then communicated to back to the control system 140. The control system 140 processes the information and transmits signals which include user-defined chemical dosage parameters to the dosing control unit 600. The received information is used to provide real-time adjustments to the source chemical replenishment rates by operating one or more of the valves housed in the dosing control unit 600, thereby maintaining a desired, and preferably constant, chemical composition of the electrolyte throughout the ECMP process. The control system 140 also removes a volume of electrolyte equivalent to the amount dosed into the fluid recycling system 272 by uses of the drain pump 343, to assure that the fluid level remains constant in the system. The fluid removed by the drain pump 343 and the waste electrolyte from the analyzer unit 610 are sent to the facility waste system (not shown) via the outlet lines 615 and 612, respectively.

In one embodiment the use of a dosing control unit 600 and an analyzer unit 610 systems can be eliminated if the electrolyte A is be delivered to substrate 114 from a source of fresh chemistry (not shown), flows past the surface of the substrate 114, and is then collected in a waste tank or drain (not shown). In this embodiment the electrolyte is not re-circulated and thus should only contact the substrate once ("single pass" design).

Further, if it is found that the concentration of the various components in the electrolyte C in the auxiliary chamber 223 are varying over time, an analyzer unit similar to the analyzer unit 610 and a dosing unit similar to the dosing control unit 600, along with the bleed pump 343 as described above, can be adapted to the auxiliary chamber 223 to control the various chemical concentrations as desired.

Figure 5:
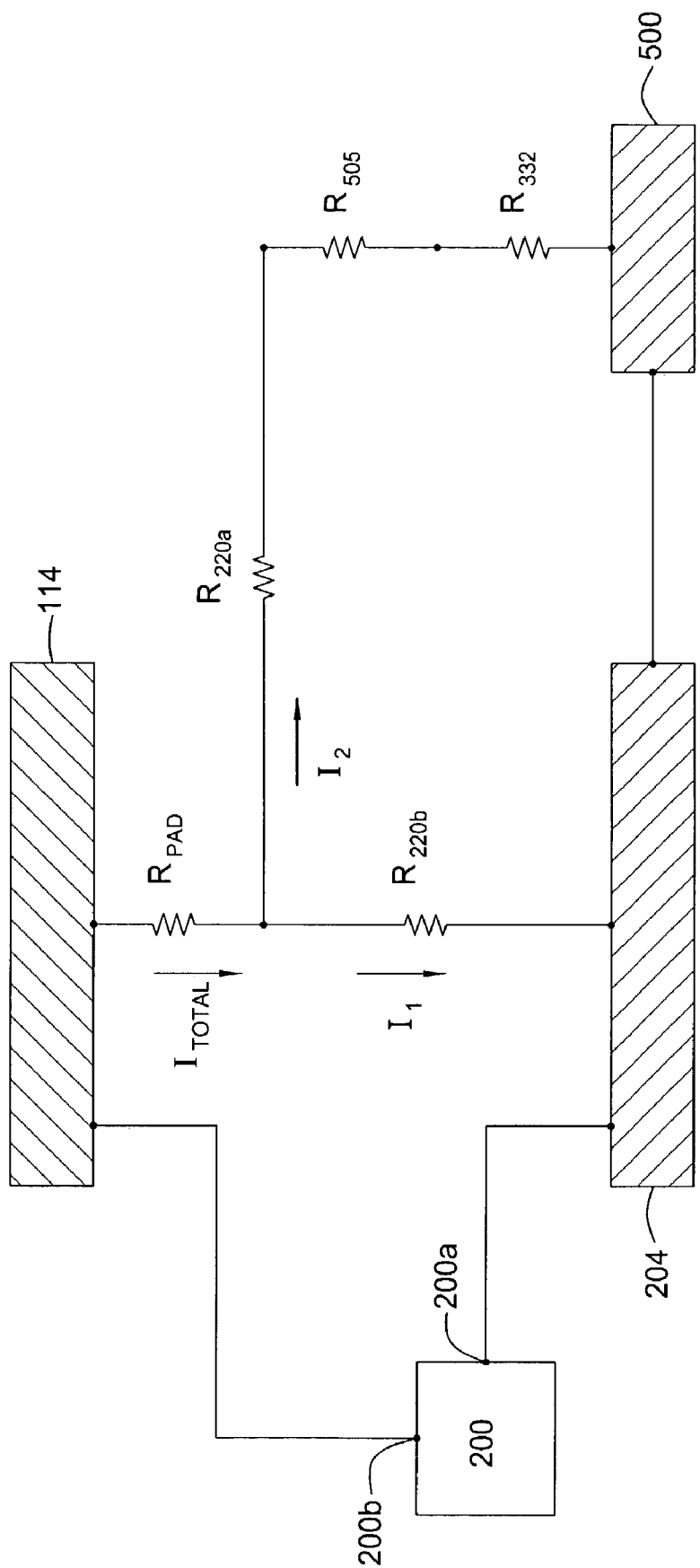
FIG. 5 is a graphical representation of the electrical characteristics of an embodiment of the current invention shown in FIG. 4.

FIG. 5 illustrates a general electrical schematic highlighting the major resistances in one embodiment of the current invention as described in FIG. 4. As shown, the power source 200 is connected to the first electrode 204, connection 501, and the third electrode 500 through the first terminal 200a. The substrate 114 is connected to the second terminal 200b through the second electrode 207, shaft 212 and rotating electrical coupling 212a. In FIG. 5 the resistance $R_{pad}$ generally takes into account the potential drop from the surface of the substrate across the polishing medium 205 and the perforated disc 206. A significant part of the potential drop signified by $R_{pad}$ is caused by the constriction of current through the pores and holes in the polishing medium 205 and the perforated disc 206. The resistance $R_{Ab}$ is defined as the average electrical resistance caused by the potential drop from the bottom of the second electrode 207 to the surface of the first electrode 204 which is predominantly affected by the conductivity of the electrolyte A. The resistance $R_{Aa}$ is defined as the average electrical resistance of the electrolyte from the bottom of the second electrode 207 to the surface of the membrane 505 (left surface as shown in FIG. 4) and is generally affected by the conductivity of the electrolyte A. The resistance $R_{505}$ is the effective electrical resistance across the membrane 505. And finally the resistance $R_C$ is defined as the average electrical resistance of the electrolyte from the surface of the membrane 505 (right surface as shown in FIG. 4) to the third electrode 500 and is generally affected by the conductivity of the electrolyte C.

Therefore, referring to FIG. 5, the total current ($I_{total}$) flowing through the ECMP chamber will divide into $I_1$ and $I_2$ due to the reactions which are occurring at either the first or the third electrodes. Using the basic concept of a current divider the current $I_1$, which is the current being supported by the first electrode (current flowing through $R_{Ab}$), will equal $I_1 = R_2/(R_1+R_2)) \times I_{total}$, where $R_1 = R_{Ab}$, $R_2 = R_{Aa} + R_{505} + R_C$, and $I_{total}$ is the total current supplied by the power source 200. Since a goal of the current invention is to reduce the gas generated during the ECMP process, the second embodiment is designed to decrease the current flow $I_1$ to a minimum such that the process uniformity (polishing uniformity) is still maintained but the gas evolution is reduced. Therefore, if the resistance $R_2$ is decreased the current $I_1$ will decrease. In general the resistance $R_2$ will decrease as the distance between the membrane 505 and the surface of the substrate 114 is decreased, the resistance across the membrane is decreased, the conductivity of the electrolyte C is increased (e.g. adding more acid, etc.), the distance of the third electrode 500 and the membrane 505 is decreased, and/or increasing the third electrode 500's surface area. Another method of decreasing the current 11 is to increase the average resistance of $R_1$ by increasing the distance of the first electrode from the surface of the substrate 114.

It is further noted that by use of certain additives in the auxiliary chamber 223 and/or in the process chamber 222, and fluid motion the effective resistances in the ECMP chamber can be further modified to achieve the desired reduction in gas evolution at the first electrode.

While foregoing is directed to various embodiments of the invention, other and further embodiments of the invention may be devised without departing from the basic scope thereof, and the scope thereof is determined by the claims that follow.

What is claimed is:

1. A electrochemical mechanical polishing system for planarizing a substrate, comprising:
   a body having a polishing surface positioned to polish the substrate;
   at least one conductive element in electrical contact with the substrate;
   a first chamber adapted to contain an electrolyte in communication with the substrate;
   a counter electrode;
   a second chamber adapted to contain an electrolyte in communication with the counter electrode;
   a permeable membrane separating the first and second chambers, wherein the permeable membrane prevents permeation of metal ions and gas there through and preferentially allows hydrogen ions to pass through; and
   a power source with one terminal in electrical contact with the conductive element and the other terminal in electrical contact with the counter electrode.

2. The polishing system of claim 1, wherein the one or more conductive elements are embedded in the polishing surface.

3. The polishing system of claim 1, wherein the permeable membrane has a surface adjacent to the counter electrode, and wherein the permeable membrane surface adjacent to the counter electrode is frustroconical in shape.

4. The polishing system of claim 3, wherein the surface is in communication with at least one vent.

5. The polish system of claim 1, wherein the second chamber contains a vent allowing trapped gas to be removed.

6. The polishing system of claim 1, wherein the electrolyte in contact with the counter electrode contains more metal ions than the electrolyte in contact with the substrate.

7. The polishing system of claim 6, wherein the metal ion is copper.

8. The polishing system of claim 7, wherein the copper ion concentration in the electrolyte solution in contact with the counter electrode is about 0.05 to about 1.2 Molar.

9. The polishing system of claim 7, wherein the copper ion concentration in the electrolyte solution in contact with the counter electrode is about 0.2 to about 0.9 Molar.

10. The polishing system of claim 6, wherein the metal ion in the electrolyte solution in contact with the counter electrode is the same as the ion being removed from the substrate polishing surface.

11. A electrochemical mechanical polishing system for planarizing a substrate, comprising:
    a body having a polishing surface positioned to polish the substrate;

at least one conductive element in electrical contact with the substrate;

a first chamber adapted to contain a first electrolyte in communication with the substrate;

a second chamber;

said second chamber containing a counter electrode;

said second chamber adapted to contain a second electrolyte, which contains a greater amount of metal ions than the first electrolyte, said second electrolyte being in contact with the counter electrode;

a permeable membrane separating the first and second chambers, wherein the permeable membrane prevents permeation of metal ions and gas there through and preferentially allows hydrogen ions to pass through; and a power source with one terminal in electrical contact with the conductive element and the other terminal in electrical contact with the counter electrode.

12. The polishing system of claim 11, wherein the at least one conductive element is embedded in the polishing surface.

13. The polishing system of claim 11, wherein the permeable membrane has a surface adjacent to the counter electrode, and wherein the permeable membrane surface adjacent to the counter electrode is frustroconical in shape.

14. The polishing system of claim 13, wherein the surface is in communication with at least one vent.

15. The polishing system of claim 11, wherein the second chamber is in communication with at least one vent.

16. The polish system of claim 11, wherein the second chamber contains a vent allowing trapped gas to be removed.

17. The polishing system of claim 11, wherein the metal ion in the second electrolyte is a copper ion.

18. The polishing system of claim 17, wherein the copper ion concentration in the second electrolyte solution is about 0.05 to about 1.2 Molar.

19. The second electrolyte of claim 17, wherein the copper ion concentration in the second electrolyte solution is about 0.2 to about 0.9 Molar.

20. The polishing system of claim 11, wherein the metal ion in the second electrolyte are the same as the ion being removed from the substrate polishing surface.

* * * * *

UNITED STATES PATENT AND TRADEMARK OFFICE
CERTIFICATE OF CORRECTION

PATENT NO. : 7,229,535 B2  
APPLICATION NO. : 10/455861  
DATED : June 12, 2007  
INVENTOR(S) : Wang et al.

Page 1 of 1

It is certified that error appears in the above-identified patent and that said Letters Patent is hereby corrected as shown below:

Title Page, Item (56) References Cited:

In the U.S. Patent Documents, on Page 3, in Column 1, Line 3, please delete "2003/0079415 A1   5/2003 Ma et al." and insert --2003/0079416 A1   5/2003 Ma et al.--.
In Column 1, Line 67, please delete "the." and insert --the--;
In Column 3, Line 41, please delete "a" and insert --an--;
In Column 4, Line 35, please delete "is graphical" and insert --is a graphical--;
In Column 4, Line 37, please delete "is graphical" and insert --is a graphical--;
In Column 5, Lines 23-24, please delete "to the to the" and insert --to the--;
In Column 8, Line 24, please delete "can made" and insert --can be made--;
In Column 14, Lines 22-23, please delete "may helpful" and insert --may be helpful--;
In Column 19, Line 33, please delete "addition," and insert --addition--;
In Column 19, Line 40, please delete "may helpful" and insert --may be helpful--;
In Column 21, Line 8, please delete "is be" and insert --is to be--;
In Column 21, Line 56, please delete "$I_1=R_2/(R_1+R_2))\times I_{total}$," and insert --$I_1=(R_2/(R_1+R_2))\times I_{total}$,--;
In Column 22, Line 4, please delete "11" and insert --$I_1$--;
In Column 22, Line 12, please delete "While" and insert --While the--.

In the Claims:
In Column 22, Claim 1, Line 18, please delete "A" and insert --An--;
In Column 22, Claim 5, Line 46, please delete "polish" and insert --polishing--;
In Column 24, Claim 16, Line 7, please delete "polish" and insert --polishing--.

Signed and Sealed this

Eighteenth Day of September, 2007

JON W. DUDAS  
*Director of the United States Patent and Trademark Office*